(12) United States Patent
Katoh et al.

(10) Patent No.: US 7,326,475 B2
(45) Date of Patent: *Feb. 5, 2008

(54) MATERIAL FOR ORGANIC ELECTROLUMINESCENT DEVICE, ORGANIC ELECTROLUMINESCENT DEVICE, ILLUMINATING DEVICE AND DISPLAY

(75) Inventors: Eisaku Katoh, Hachioji (JP); Hiroshi Kita, Hachioji (JP); Tomohiro Oshiyama, Hachioji (JP); Mitsuhiro Fukuda, Chofu (JP); Yoshiyuki Suzuri, Musashino (JP); Noriko Ueda, Hino (JP)

(73) Assignee: Konica Minolta Holdings, Inc., Tokyo (JP)

( * ) Notice: Subject to any disclaimer, the term of this patent is extended or adjusted under 35 U.S.C. 154(b) by 145 days.

This patent is subject to a terminal disclaimer.

(21) Appl. No.: 10/532,027

(22) PCT Filed: Apr. 20, 2004

(86) PCT No.: PCT/JP2004/005621

§ 371 (c)(1),
(2), (4) Date: Apr. 21, 2005

(87) PCT Pub. No.: WO2004/095891

PCT Pub. Date: Nov. 4, 2004

(65) Prior Publication Data

US 2006/0121308 A1  Jun. 8, 2006

(30) Foreign Application Priority Data

Apr. 23, 2003 (JP) ............................. 2003-117886
Jan. 23, 2004 (JP) ............................. 2004-015487

(51) Int. Cl.
*H01L 51/54* (2006.01)
*H05B 33/14* (2006.01)
*C09K 11/06* (2006.01)
*C07D 471/10* (2006.01)

(52) U.S. Cl. .................. 428/690; 428/917; 313/504; 313/506; 548/429; 544/184; 544/250; 544/345; 546/85

(58) Field of Classification Search ................ 428/690, 428/917; 313/504, 506; 544/250, 251, 115, 544/184, 345; 548/429, 85; 546/85
See application file for complete search history.

(56) References Cited

U.S. PATENT DOCUMENTS 5,326,868 A * 7/1994 Thurkauf et al. ........... 544/250

FOREIGN PATENT DOCUMENTS

JP   54-11736 A   1/1979

(Continued)

OTHER PUBLICATIONS

Acyclo C-nucleoside analogs; Nagwa Rashed, Nucleosides & Nucleotides; 1998, 17(8), pp. 1373-1384.*

(Continued)

*Primary Examiner*—Milton I. Cano
*Assistant Examiner*—Camie S. Thompson
(74) *Attorney, Agent, or Firm*—Frishauf, Holtz, Goodman & Chick, P.C.

(57) ABSTRACT

The present invention provides: an organic EL element exhibiting high luminance, a high external quantum efficiency and a long high temperature driving life at 50° C.; an illuminator and a display device employing the organic EL element; and a material preferably used for the organic EL element.

17 Claims, 3 Drawing Sheets

FOREIGN PATENT DOCUMENTS

| | | | |
|---|---|---|---|
| JP | 06-001972 | * | 1/1994 |
| JP | 07-110940 B2 | | 11/1995 |
| JP | 2001-160488 A | | 6/2001 |
| JP | 2003-109767 A | | 4/2003 |
| WO | WO 2004/053019 A1 | | 6/2004 |

OTHER PUBLICATIONS

U.S. Appl. No. 10/519,107, filed Dec. 23, 2004, Suzuri et al.

Thompson, et al., "Phosphorescent Materials and Devices", The 10th International Workshop on Inorganic and Organic Electroluminescence (EL '00, Hamamatsu), University of Southern California, Princeton University and Universal Display Corporation, Ewing, NJ, pp. 35-38.

Yang, et al., "High Efficiency Organic Emitting Devices Using New Iridium Complexes", The 10th International Workshop on Inorganic and Organic Electroluminescence (EL '00, Hamamatsu), Kyushu University, Kasuga, Fukuoka, Japan, pp. 227-229.

Ikai et al., "Highly efficient phosphorescence from organic light emitting devices with tris(2-phenylpyridine)iridium doped into hole-transporting materials", The 10th International Workshop on Inorganic and Organic Electroluminescence (EL '00, Hamamatsu), TOYOTA Central Research & Development Laboratories, Inc., Nagakute, Aichi, Japan, pp. 175-177.

* cited by examiner

MATERIAL FOR ORGANIC ELECTROLUMINESCENT DEVICE, ORGANIC ELECTROLUMINESCENT DEVICE, ILLUMINATING DEVICE AND DISPLAY

This application is the United States national phase application of International Application PCT/JP2004/005621 filed Apr. 20, 2004.

TECHNICAL FIELD

The present invention relates to a material for organic electroluminescent element, an organic electroluminescent element, an illuminator and display device.

BACKGROUND ART

As an emission type electronic displaying device, an electroluminescence device (ELD) is known. Elements constituting the ELD include an inorganic electroluminescent element and an organic electroluminescent element (hereinafter referred to also as an organic EL element).

An inorganic electroluminescent element has been used for a plane light source, however, a high voltage alternating current has been required to drive the element.

An organic EL element has a structure in which a light emitting layer containing a light emitting compound is arranged between a cathode and an anode; and an electron and a hole are injected into the light emitting layer and recombine to form an exciton. The element emits light, utilizing light (fluorescent light or phosphorescent light) generated by inactivation of the exciton, and the element can emit light by applying a relatively low voltage of several volts to several tens of volts. The element has a wide viewing angle and a high visuality since the element is of self light emission type. Further, the element is a thin, complete solid element, and therefore, the element is noted from the viewpoint of space saving and portability.

A practical organic EL element is required to emit light of high luminance with high efficiency at a lower power. For example, disclosed are an element exhibiting higher luminance of emitting light with longer life in which stilbene derivatives, distyrylarylene derivatives or tristyrylarylene derivatives doped with a slight amount of a fluorescent compound are employed (see Patent Document 1); an element which has an organic light emitting layer containing 8-hydroxyquinoline aluminum complex as a host compound doped with a slight amount of a fluorescent compound (see Patent Document 2); and an element which has an organic light emitting layer containing 8-hydroxyquinoline aluminum complex as a host compound doped with a quinacridone type dye (see Patent Document 3).

When light emitted through excited singlet state is used in the element disclosed in the above Patent documents, the upper limit of the external quantum efficiency ($\eta$ext) is considered to be at most 5%, because the generation probability of excited species capable of emitting light is 25%, since the generation ratio of singlet excited species to triplet excited species is 1:3, and further, external light emission efficiency is 20%.

Since an organic EL element, employing phosphorescence through the excited triplet, was reported by Princeton University (see Non-Patent Document 1), studies on materials emitting phosphorescence at room temperature have been actively carried out (see Non-Patent Document 2 and Patent Document 4).

As the upper limit of the internal quantum efficiency of the excited triplet is 100%, the light emission efficiency of the exited triplet is theoretically four times that of the excited singlet. Accordingly, light emission employing the excited triplet exhibits almost the same performance as a cold cathode tube, and can be applied to illumination.

For example, many kinds of heavy metal complexes such as iridium complexes have been synthesized and studied (see Non-Patent Document 3).

An example employing tris(2-phenylpyridine)iridium as a dopant has also been studied (see Non-Patent Document 2).

Other examples of a dopant which has been studied include, $L_2Ir$ (acac) such as $(ppy)_2Ir$ (acac) (see Non-Patent Document 4), tris(2-(p-tolyl)pyridine)iridium $(Ir(ptpy)_3)$, tris(benzo[h]quinoline)iridium $(Ir(bzq)_3)$ and $Ir(bzq)_2ClP$ $(Bu)_3$ (see Non-Patent Document 5).

A hole transporting material is used as a host of a phosphorescent compound in order to increase emission efficiency (see Non-Patent Document 6).

Various kinds of electron transporting materials doped with a new iridium complex are used as a host of a phosphorescent compound (see Non-Patent Document 4). High emission efficiency has been obtained by incorporating a hole blocking layer (see Non-Patent Document 5).

At present, an organic electroluminescent element emitting phosphorescence with further higher emission efficiency and longer life has been studied.

An external quantum efficiency of around 20%, which is a theoretical threshold, has been attained in green light emission in a lower current region (a lower luminance region), however, the theoretical threshold has not been attained in a higher current region (a higher luminance region). Further, a sufficient emission efficiency has not been attained in other color emission, where further improvement is required. With respect to the practical use in the near future, required is an organic EL element which efficiently emits light with high luminance at a lower power. Specifically, an organic EL element which emits a blue phosphorescence with high efficiency is required.

Accordingly, an object of the present invention is to provide a material for an organic electroluminescent element, an organic electroluminescent element, an illuminator and a display device employing the material for the organic electroluminescent element, which exhibit high emission efficiency and, further, to provide a material for an organic electroluminescent element; and an organic electroluminescent element, an illuminator and a display device employing the material for an organic electroluminescent element, which exhibit long life.

Materials containing an aromatic ring having a nitrogen atom, for example, a carbazole ring such as CBP, have been well known to exhibit a high emission efficiency when used as a material for an organic electroluminescent element, for example, a host material exhibiting the above mentioned phosphorescent emission. In the present invention, certain-nitrogen-containing aromatic compounds containing some of carbazole analogues were found to exhibit high emission efficiency when used as a material for the organic electroluminescent element.

Some of the compounds containing carbazole analogues have been already disclosed, for example, a thermally stable hole transporting material having an aromatic heterocycle containing nitrogen as a partial structure and having a chemical structure extending in three or four directions from a nitrogen atom, or from an aryl portion as a center (see Patent Document 5).

Further, a light emitting material containing an aromatic heterocyclic compound having nitrogen and exhibiting high luminance, has been disclosed (see Patent Document 6).

However, in Patent Document 5, a nitrogen-containing aromatic heterocyclic compound having a diazacarbazole structure has not been fully disclosed. In Patent Document 6, among the nitrogen-containing aromatic compounds, only those having molecular weight of less than 450 have been disclosed. Further, in both Patent Documents, an organic electroluminescent element exhibiting phosphorescent emission has not been fully disclosed.

(Patent Document 1)
Japanese Pat. No. 3093796
(Patent Document 2)
Japanese Patent Publication Open to Public Inspection (hereafter referred to as JP-A) No. 63-264692
(Patent Document 3)
JP-A No. 3-255190
(Patent Document 4)
U.S. Pat. No. 6,097,147
(Patent Document 5)
Examined Japanese Patent Publication No. 7-110940
(Patent Document 6)
JP-A No. 2001-160488
(Non-Patent Document-1)
M. A. Baldo et al., Nature, 395, 151-154 (1998)
(Non-Patent Document 2)
M. A. Baldo et al., Nature, 403(17), 750-753 (2000)
(Non-Patent Document 3)
S. Lamansky et al., J. Am. Chem. Soc., 123, 4304 (2001)
(Non-Patent Document 4)
M. E. Tompson et al., The 10th International Workshop on Inorganic and Organic Electroluminescence (EL '00, Hamamatsu)
(Non-Patent Document 5)
Moon-Jae Youn. Og, Tetsuo Tsutsui et al., The 10th International Workshop on Inorganic and Organic Electroluminescence (EL '00, Hamamatsu)
(Non-Patent Document 6)
Ikai et al., The 10th International Workshop on Inorganic and Organic Electroluminescence (EL '00, Hamamatsu)

DISCLOSURE OF THE INVENTION

The above object of the present invention is achieved by the following structures (1) through (13):

(1) A pyrrole derivative for an organic electroluminescent element represented by Formula (1), and having a molecular weight of not less than 450:

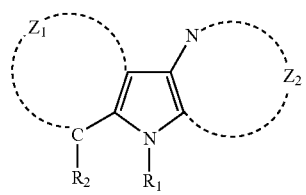

Formula (1)

wherein:

$R_1$ represents an alkyl group which may have a substituent, a cycloalkyl group which may have an aryl group which may have a substituent or a heterocyclic group which may have a substituent;

$R_2$ represents a hydrogen atom or a substituent;

$Z_1$ represents a group of atoms necessary to form a 5- to 7-membered fused ring combined with two carbon atoms; and $Z_2$ represents a group of atoms necessary to form a nitrogen-containing 5- to 7-membered heterocycle combined with a carbon atom and a nitrogen atom.

(2) The pyrrole derivative for the organic electroluminescent element of Item (1), wherein the pyrrole derivative is represented by Formula (2):

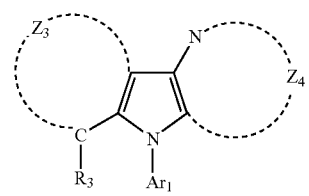

Formula (2)

wherein:

$Ar_1$ represents an aryl group which may have a substituent, or a heterocyclic group which may have a substituent;

$R_3$ represents a hydrogen atom or a substituent; and $Z_3$ and $Z_4$ each represent a group of atoms necessary to form a 5- to 7-membered fused ring (3) The pyrrole derivative for the organic electroluminescent element of Item (1), wherein the pyrrole derivative is represented by one of Formulae (3) to (6):

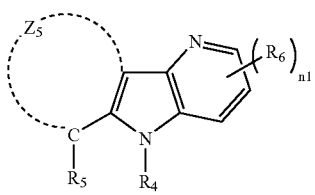

Formula (3)

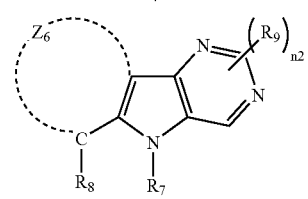

Formula (4)

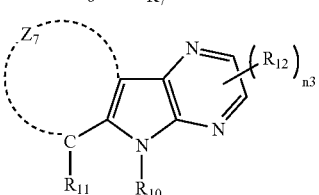

Formula (5)

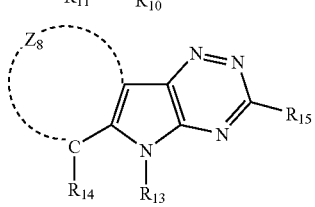

Formula (6)

wherein:

$R_4$, $R_7$, $R_{10}$ and $R_{13}$ each represent an alkyl group which may have a substituent, a cycloalkyl group which may have a substituent, an aryl group which may have a substituent or a heterocyclic group which may have a substituent;

$R_5$, $R_6$, $R_8$, $R_9$, $R_{11}$, $R_{12}$, $R_{14}$ and $R_{15}$ each represent a substituent;

$Z_5$ through $Z_8$ each represent a group of atoms necessary to form a 5- to 7-membered fused ring;

n1 represents an integer of 0 to 3; and n2 and n3 each represent an integer of 0 to 2.

(4) The pyrrole derivative for the organic electroluminescent element of Item (1), wherein the pyrrole derivative is represented by one of Formulae (7) to (10):

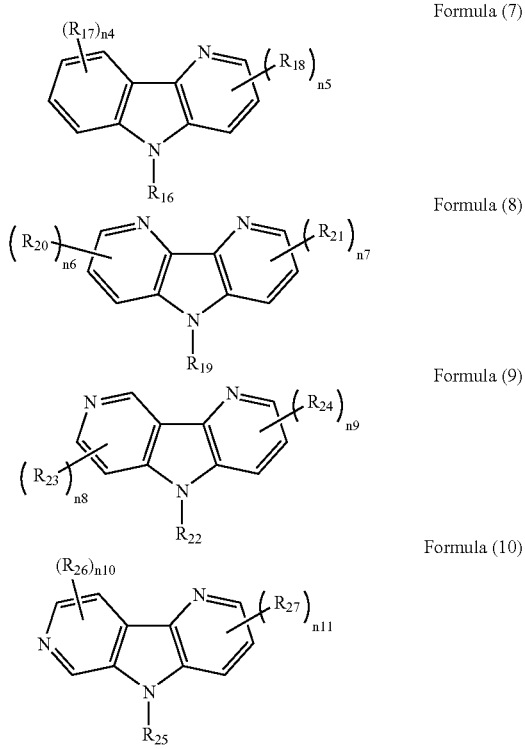

Formula (7)

Formula (8)

Formula (9)

Formula (10)

wherein:

$R_{16}$, $R_{19}$, $R_{22}$ and $R_{25}$ each represent an alkyl group which may have a substituent, a cycloalkyl group which may have a substituent, an aryl group which may have a substituent or a heterocyclic group which may have a substituent;

$R_{17}$, $R_{18}$, $R_{20}$, $R_{21}$, $R_{23}$, $R_{24}$, $R_{26}$, and $R_{27}$ each represent a substituent;

n4 represents an integer of 0 to 4; and n5 through n11 each represent an integer of 0 to 3.

(5) The pyrrole derivative for the organic electroluminescent element of Item (1), wherein the pyrrole derivative is represented by Formula (11):

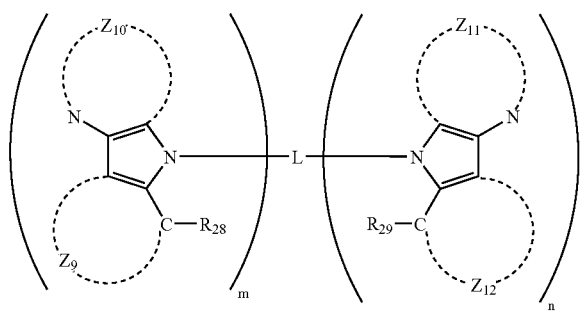

Formula (11)

wherein:

$R_{28}$, and $R_{29}$ each represent a hydrogen atom or a substituent; $Z_9$ and $Z_{12}$ each represent a group of atoms necessary to form a 5- to 7-membered fused ring;

$Z_{10}$ and $Z_{11}$ each represent a group of atoms necessary to form a nitrogen-containing 5- to 7-membered heterocycle;

L represents a linking group of divalent through tetravalent; and m and n each represent an integer of 1 or 2.

(6) The material for the organic electroluminescent element of any one of Items (1) to (5), wherein a wavelength giving a fluorescence maximum of the pyrrole derivative represented by Formula (1) or Formula (2) is not more than 500 nm.

(7) The organic electroluminescent element comprising a pair of electrodes having therebetween one or more constituting layers, wherein:

at least one of the constituting layers is a light emitting layer;

one of the constituting layers contains the pyrrole derivative for the organic electroluminescent element of any one of Items (1) to (6).

(8) The organic electroluminescent element of Item (7), wherein the light emitting layer contains the pyrrole derivative for the organic electroluminescent element.

(9) The organic electroluminescent element of Item (7) or Item (8), wherein the constituting layers contain a hole blocking layer containing the pyrrole derivative for the organic electroluminescent element.

(10) The organic electroluminescent element of any one of Items (7) to (10), wherein the organic electroluminescence element emits blue light.

(11) The organic electroluminescence element of any one of Items (7) to (10), wherein the organic electroluminescent element emits white light.

(12) An illuminator comprising the organic electroluminescent element of any one of Items (7) to (11).

(13) A display device comprising the organic electroluminescent element of any one of Item (7) to (11).

BEST MODE FOR CARRYING OUT THE INVENTION

Figure 1:
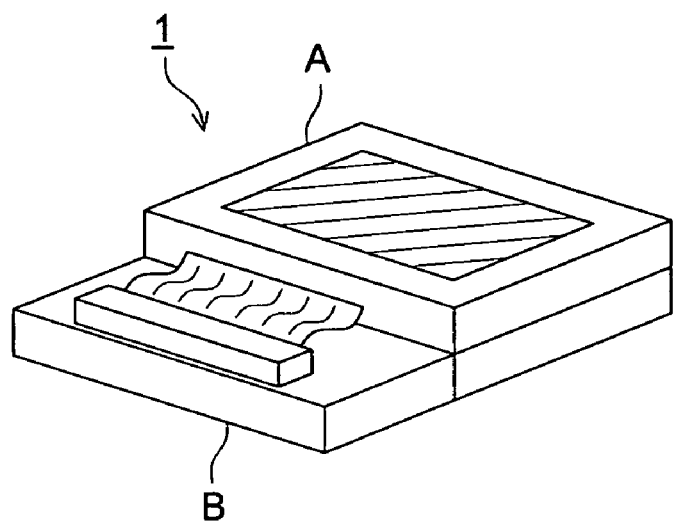
FIG. 1 is a schematic drawing of one example of a display device having an organic EL element.

By employing at least one of the materials for an organic EL element prescribed by one of the above (1) to (6), obtained was the organic electroluminescent element (hereafter referred to as the organic EL element) of the present invention prescribed by any one of the above (7) to (11), which exhibited high luminance, high external efficiency, and long life.

Details of the constituting elements of the present invention will now be explained.

<<Materials for Organic EL Elements>>

Materials for an organic EL element used in the present invention will be explained.

<<Material for Organic EL Element Represented by Formula (1)>>

The material for the organic EL element represented by Formula (1) will be explained.

An organic EL element employing the material for the organic EL element represented by Formula (1) was found to exhibit high emission efficiency. Further, an organic EL element employing the material for the organic EL element represented by Formula (1) was found to exhibit high external efficiency and long life.

Also, among pyrrole derivatives represented by Formula (1) of which the molecular weight is not less than 450, a pyrrole derivative represented by any one of Formula (2), Formulas (3) through (6), Formulas (7) through (10) and Formula (11), were found to more preferably exhibits the effect of the present invention.

In Formula (1), examples of an alkyl group represented by $R_1$, which may have a substituent, include: a methyl group, an ethyl group, a propyl group, an isopropyl group, a tert-butyl group, a pentyl group, a hexyl group, an octyl group, a dodecyl group, a tridecyl group, a tetradecyl group and a pentadecyl group. Substituents which may be contained in the above alkyl group include the substituents represented by $R_2$ which will be described later.

In Formula (1), examples of an cycloalkyl group represented by $R_1$, which may have a substituent, include: a cyclopentyl group and a cyclohexyl group. Substituents which may be contained in the above cycloalkyl group include the substituents represented by $R_2$ which will be described later.

In Formula (1), examples of an aryl group represented by $R_1$, which may have a substituent, include: a phenyl group, a p-chlorophenyl group, a mesityl group, a tolyl group, a xylyl group, a biphenylyl group, a naphthyl group, an anthryl group and a phenanthryl group. Substituents which may be contained in the above aryl group include the substituents represented by $R_2$ which will be described later.

In Formula (1), examples of an heterocyclic group represented by $R_1$, which may have a substituent, include: aromatic heterocyclic groups, for example: a furil group, a thienyl group, a pyridyl group, a pyridazinyl group, a pyrimidinyl group, a pyrazinyl group, the triazinyl group, an imidazolyl group, a pyrazolyl group, a thiazolyl group, a carbazolyl group, a carbolinyl group, a diazacarbazolyl group (herein a diazacarbazolyl group is a group in which at least one of the carbon atoms which form a carboline ring is replaced by a nitrogen atom, and it can also be abbreviated as azacarbolinyl), a quinazolinyl group and a phthalazinyl group; and non-aromatic heterocyclic groups, for example, an isochromanyl group, a pyrrolidinyl group, a chromanyl group, an imidazolidinyl group, an imidazolinyl group, a morpholinyl group, a piperidyl group, a piperazinyl group, a pyrazolinyl group, a pyrazolidinyl group and an oxazolidinyl group. Substituents which may be contained in the above heterocyclic group include the substituents represented by $R_2$ which will be described later.

In Formula (1), examples of a substituent represented by $R_2$ include: alkyl groups (for example, a methyl group, an ethyl group, a propyl group, an isopropyl group, a tert-butyl group, a pentyl group, a hexyl group, an octyl group, a dodecyl group, a tridecyl group, a tetradecyl group and a pentadecyl group), cycloalkyl groups (for example, a cyclopentyl group and a cyclohexyl group), alkenyl groups (for example, a vinyl group and an allyl group), alkynyl groups (for example, an ethynyl group and a propargyl group), aryl groups (for example, a phenyl group and a naphthyl group), aromatic heterocyclic groups (for example, a furil group, a thienyl group, a pyridyl group, a pyridazinyl group, a pyrimidinyl group, a pyrazinyl group, a triazinyl group, an imidazolyl group, a pyrazolyl group, a thiazolyl group, a carbazolyl group, a carbolinyl group, a diazacarbazolyl group, a quinazolinyl group and a phthalazinyl group), heterocyclic groups (for example, an isochromanyl group, a pyrrolidinyl group, a chromanyl group, an imidazolydinyl group, an imidazolinyl group, a morpholinyl group, a piperidyl group, a piperazinyl group, a pyrazolinyl group, a pyrazolidinyl group and an oxazolidinyl group), alkoxyl groups (for example, a methoxy group, an ethoxy group, a propyloxy group, a pentyloxy group, a hexyloxy group, an octyloxy group and a dodecyloxy group), cycloalkoxyl groups (for example, a cyclopentyloxy group and a cyclohexyloxy group), aryloxy groups (for example, a phenoxy group and a naphthyloxy group), alkylthio groups (for example, a methylthio group, an ethylthio group, a propylthio group, a pentylthio group, a hexylthio group, an octylthio group and a dodecylthio group), cycloalkylthio groups (for example, a cyclopentylthio group and a cyclohexylthio group), arylthio groups (for example, a phenylthio group and a naphthylthio group), an alkoxycarbonyl group (for example, a methyloxycarbonyl group, an ethyloxycarbonyl group, a butyloxycarbonyl group, an octyloxycarbonyl group and a dodecyloxycarbonyl group), aryloxycarbonyl groups (for example, a phenyloxycarbonyl group and a naphthyloxycarbonyl group), sulfamoyl groups (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylamino sulfonyl group and a 2-pyridylaminosulfonyl group), acyl groups (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenyl carbonyl group, a naphthylcarbonyl group and a pyridylcarbonyl group), acyloxy groups (for example, an acetyloxy group, an ethylcarbonyloxy group, a butylcarbonyloxy group, an octylcarbonyloxy group, a dodecylcarbonyloxy group and a phenylcarbonyloxy group), amide groups (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group and a naphthylcarbonylamino group), carbamoyl groups (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, 2-ethylhexylaminocarbonyl group, a dodecylaminocarbonyl group, a phenylaminocarbonyl group, a naphthylaminocarbonyl group and a 2-pyridylaminocarbonyl group), ureide groups (for example, a methylureide group, an ethylureide group, a pentylureide group, a cyclohexylureide group, an octylureide group, a dodecylureide group, a phenylureide group, a naphthylureide group and a 2-pyridylaminoureide group), sulfinyl groups (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group), alkylsulfonyl groups (for example, a methylsulfonyl group, an ethylsulfonyl group, a butylsulfonyl group, a cyclohexylsulfonyl group, a 2-ethylhexylsulfonyl group and a dodecylsulfonyl group), arylsulfonyl groups (a phenylsulfonyl group, a naphthylsulfonyl group and a 2-pyridylsulfonyl group), amino groups (for example, an amino group, an ethylamino group, a dimethylamino group, a butylamino group, a cyclopentylamino group, a 2-ethylhexylamino group, a dodecylamino group, an anilino group, a naphthylamino group and a 2-pyridylamino group), halogen atoms (for example, a fluorine atom, a chlorine atom and a bromine atom), fluorohydrocarbon groups (for example, a fluoromethyl group, a trifluoromethyl group, a pentafluoroethyl group and a pentafluorophenyl group), a cyano group, a nitro group, a hydroxy group, a mercapto group and silyl groups (for example, a trimethylsilyl group, a triisopropylsilyl group, a triphenylsilyl group and a phenyldiethylsilyl group).

These substituents may further be substituted by the above substituents, or a plurality of these substituents may be combined each other to form a ring.

In Formula (1), examples of a 5- to 7-membered fused ring represented by $Z_1$ include: a cyclopentene ring, a cyclopentadiene ring, a benzene ring, a pyridine ring, a thiopyran ring, a pyran ring, a cyclohexene ring, a cyclohexadiene ring, a cycloheptene ring, a cycloheptadiene ring, a furan ring, a thiophene ring, a pyridine ring, a pyridazine ring, a pyrimidine ring, a pyrazine ring, a triazine ring, an oxydiazole ring, a triazole ring, an imidazole ring, a pyrazole ring, a thiazole ring and an indole ring. The 5- to 7-membered ring represented by $Z_1$ may be substituted by a substituent represented by $R_2$ in Formula (1).

In Formula (1), examples of a 5- to 7-membered nitrogen-containing heterocucle represented by $Z_2$ include: a pyridine ring, a pyridazine ring, a pyrimidine ring, a pyrazine ring, a triazine ring, an oxadiazole ring, a triazole ring, an imidazole ring, a pyrazole ring and a thiazole ring. The 5- to 7-membered ring represented by $Z_1$ may be substituted by a substituent represented by $R_2$ in Formula (1).

<<Material for Organic EL Element Represented by Formula (2)>>

Materials for the organic EL element represented by Formula (2) of the present invention will be explained.

The aryl groups represented by $Ar_1$ in Formula (2), which may have a substituent, are common to the aryl groups represented by $R_1$ in Formula (1), which may have a substituent.

The heterocyclic groups represented by $Ar_1$ in Formula (2), which may have a substituent, are common to the substituents represented by $R_1$ in Formula (1), which may have a substituent.

The substituents represented by $R_3$ in Formula (2) are common to the substituents represented by $R_2$ in Formula (1).

The 5- to 7-membered rings represented by $Z_3$ in Formula (2) are common to the 5- to 7-membered rings represented by $Z_1$ in Formula (1)

The 5- to 7-membered nitrogen-containing heterocycles represented by $Z_4$ in Formula (2) are common to the 5- to 7-membered nitrogen-containing heterocycles represented by $Z_2$ in Formula (1).

<<Materials for Organic EL Element Represented by any One of Formulas (3) Through (6)>>

Materials for the organic EL element represented by Formulas (3) through (6) of the present invention will be explained.

In Formulas (3) through (6), the alkyl groups which may have a substituent, the cycloalkyl groups which may have a substituent, the aryl groups which may have a substituent, and the heterocyclic groups which may have a substituent, represented by $R_4$, $R_7$, $R_{10}$ and $R_{13}$ are common to the the alkyl groups which may have a substituent, the cycloalkyl groups which may have a substituent, the aryl groups which may have a substituent, and the heterocyclic groups which may have a substituent, respectively, represented by $R_1$ in Formula (1).

In Formulas (3) through (6), the substituents represented by $R_5$, $R_6$, $R_8$, $R_9$, $R_{11}$, $R_{12}$, $R_{14}$ and $R_{15}$ are common to the substituents represented by $R_2$ in Formula (1)

In Formula (3), the 5- to 7-membered rings represented by $Z_5$ to $Z_8$ are common to the 5- to 7-membered rings represented by $Z_1$ in Formula (1).

<<Materials for Organic EL Element Represented by any One of Formulas (7) Through (10)>>

Materials for the organic EL element represented by Formulas (7) through (10) of the present invention will be explained.

In Formulas (7) through (10), the alkyl groups which may have a substituent, the cycloalkyl groups which may have a substituent, the aryl groups which may have a substituent, and the heterocyclic groups which may have a substituent, represented by $R_{16}$, $R_{19}$, $R_{22}$ and $R_{25}$ are common to the the alkyl groups which may have a substituent, the cycloalkyl groups which may have a substituent, the aryl groups which may have a substituent, and the heterocyclic groups which may have a substituent, respectively, represented by $R_1$ in Formula (1).

In Formulas (7) through (10), the substituents represented by $R_{17}$, $R_{18}$, $R_{20}$, $R_{21}$, $R_{23}$, $R_{24}$, $R_{26}$ and $R_{27}$ are common to the substituents represented by $R_2$ in Formula (1).

<<Materials for Organic EL Element Represented by Formula (11)>>

Materials for the organic EL element represented by Formula (11) of the present invention will be explained.

In Formula (11), the substituents represented by $R_{28}$ and $R_{29}$ are common to the substituents represented by $R_2$ in Formula (1).

In Formula (11), the 5- to 7-membered rings represented by $Z_9$ and $Z_{12}$ are common to the 5- to 7-membered rings represented by $Z_1$ in Formula (1).

In Formula (11), the 5- to 7-membered nitrogen-containing heterocycles represented by $Z_{10}$ and $Z_{11}$ are common to the 5- to 7-membered nitrogen-containing heterocycles represented by $Z_2$ in Formula (1).

As candidates for a linking group represented by L in Formula (11), employed may be: hydrocarbon groups, for example, an alkylene group, an alkenylene group, an alkynylene group and an arylene group; the above-mentioned alkenylene group, the alkynylene group and the arylene group, containing a hetero atom (a nitrogen atom, a sulfur atom or a silicon atom); compounds containing an aromatic heterocycle (also referred to as an aromatic heterocyclic compounds), for example, a thiophene-2,5-diyl group and a pyrazine-2,3-diyl group; chalcogen atoms, for example, an oxygen atom and a sulfur atom; linking groups in which connection via a hetero atom is contained, for example, an alkylimino group, a dialkylsilanediyl group and a diarylgermanediyl group.

Examples of an alkylene group which is a divalent linking group represented by L include: an ethylene group, a trimethylene group, a tetramethylene group, a propylene group, an ethylethylene group, a pentamethylene group, a hexamethylene group, a 2,2,4-trimethylhexamethylene group, a heptamethylene group, an octamethylene group, a nonamethylene group, a decamethylene group, an undecamethylene group, a dodecamethylene group, a cyclohexylene groups (such as, a 1,6-cyclohexanediyl group), or a cyclopentylene group (for example, a 1,5-cyclopentanediyl group).

Examples of an alkenylene group which is a divalent linking group represented by L include: a propenylene group, a vinylene group (also referred to as an ethynylene group) and a 4-propyl-2-pentenylene group.

Examples of an alkynylene group which is a divalent linking group represented by L include an ethynylene group and a 3-pentynylene group.

Examples of an arylene group which is a divalent linking group represented by L include: an o-phenylene group, a m-phenylene group, a p-phenylene group, a naphthalenediyl group, an anthracenediyl group, a naphthacenediyl group, a pyrenediyl group, a naphthylnaphthalenediyl group, a biphenyldiyl groups (for example, a 3,3'-biphenyldiyl group, and a 3,6-biphenyldiyl group), a terphenyldiyl group, a quaterphenyldiyl group, a kinkphenyldiyl group, a sexiphenyldiyl group, a septiphenyldiyl group, an octiphenyldiyl group, a noviphenyldiyl group and a deciphenyldiyl group.

Examples of a divalent linking group containing a divalent heterocyclic group represented by L include: an oxazolediyl group, a pyrimidinediyl group, a pyridazinediyl group, a pyrandiyl group, a pyrrolinediyl group, an imidazolinediyl group, an imidazolidinediyl group, a pyrazolidinediyl group, a pyrazolinediyl group, a piperidinediyl group, a piperazinediyl group, a morpholinediyl group and a quinuclidinediyl group; or may be a divalent linking group based on a compound containing an aromatic heterocycle (also referred to as an aromatic heterocyclic compound), for example, a thiophene-2,5-diyl group.

Examples of a trivalent linking group represented by L include: an ethanetriyl group, a propanetriyl group, a butane triyl group, a pentanetriyl group, a hexanetriyl group, a heptanetriyl group, an octantriyl group, a nonanetriyl group, a decanetriyl group, an undecanetriyl group, a dodecanetriyl group, a cyclohexanetriyl group, a cyclopentanetriyl group, a benzenetriyl group, a naphthalenetriyl group and a triazinetriyl group. Also, the above listed divalent linking groups each of which is further connected with a divalent linking group may be employed as trivalent linking groups.

In Formula (11), examples of a tetravalent linking group represented by L include: a propanediylidene group, a 1,3-propanediyl-2-ylidene group, a butanediylidene group, a pentanediylidene group, a hexanediylidene group, a heptanediylidene group, an octanediylidene group, a nonanediylidene group, a decanediylidene group, an undecanediylidene group, a dodecanediylidene group, a cyclohexanediylidene group, a cyclopentanediylidene group, a benzenetetrayl group and a naphthalenetetrayl group.

Also, the above listed trivalent linking groups each of which is further connected with a divalent linking group (a trivalent linking group connected with a divalent linking group forms a tetravalent linking group) may be employed as tetravalent linking groups.

Specific examples of materials for the organic EL element of the present invention will be shown below, however, the present invention is not limited thereto:

| Compound | Central Moiety | A |
|---|---|---|
| 1 | 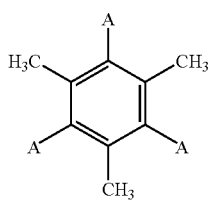 | 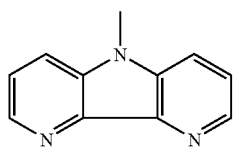 |
| 2 | 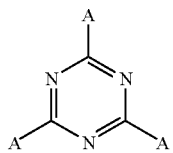 | 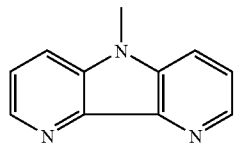 |
| 3 | 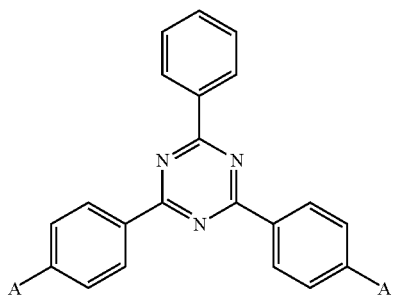 | 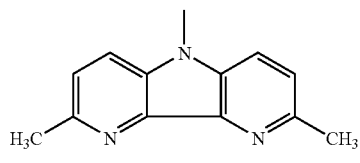 |

-continued
| Compound | Central Moiety | A |
|---|---|---|
| 4 | 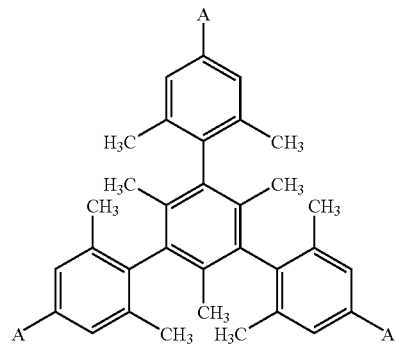 | 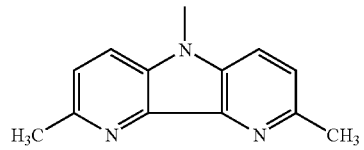 |
| 5 | 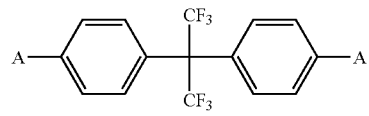 | 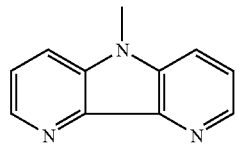 |
| 6 | 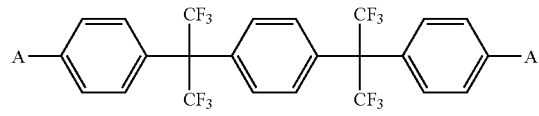 | 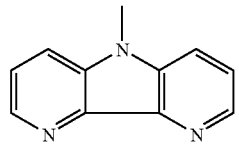 |
| 7 | 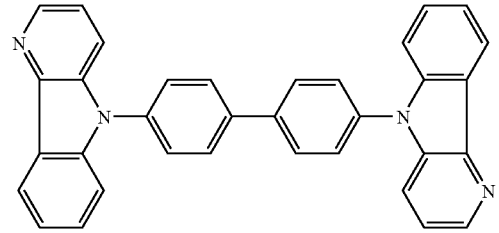 | |
| 8 | 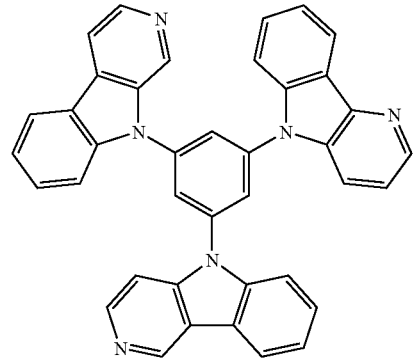 | |

-continued
| Compound | Central Moiety | A |
|---|---|---|
| 9 | | 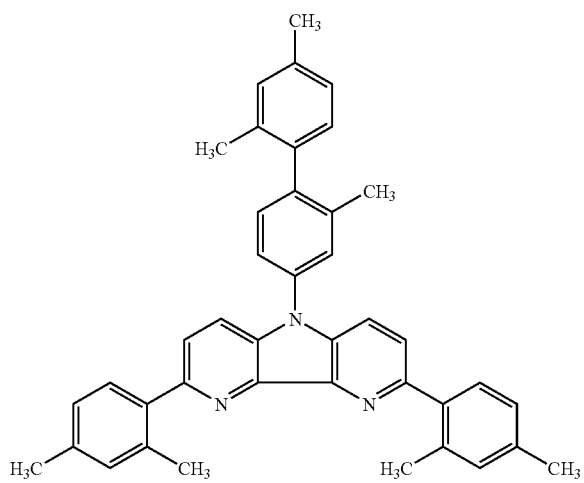 |
| 10 | | 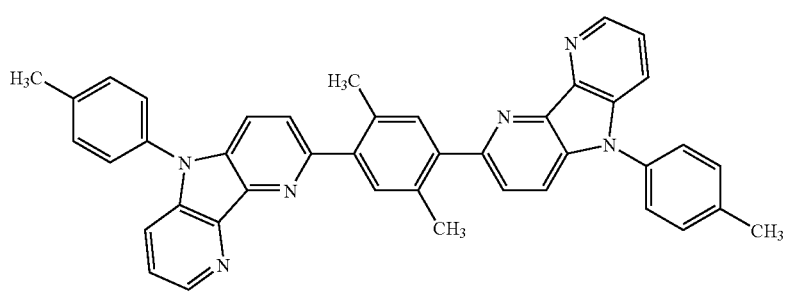 |
| 11 | 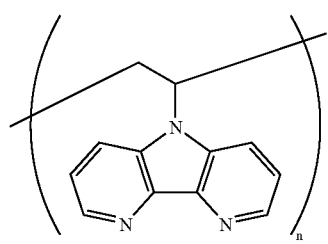 | |
| 12 | | 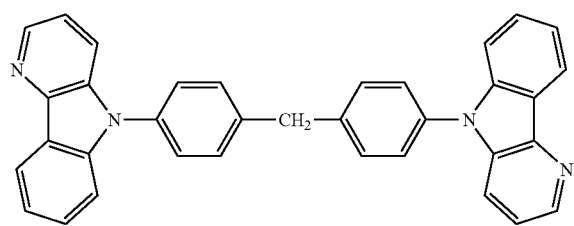 |
| 13 | | 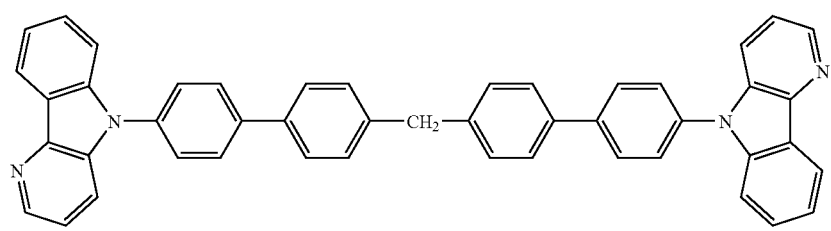 |

-continued

| Compound | Central Moiety | A |
|---|---|---|
| 14 | | |
| 15 | | |
| 16 | | |
| 17 | | |
| 18 | | |

-continued
| Compound | Central Moiety | A |
|---|---|---|
| 19 | 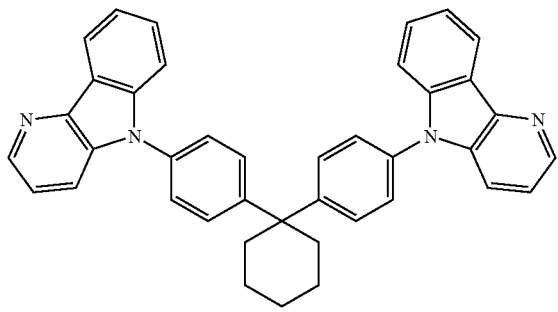 | |
| 20 | 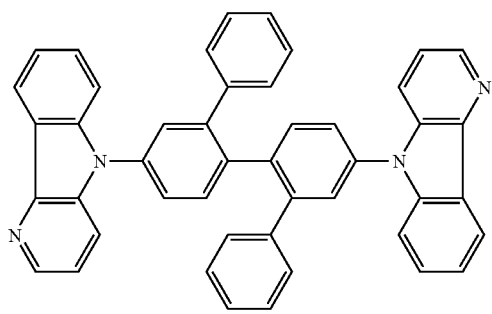 | |
| 21 | 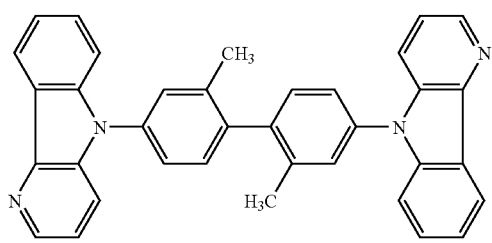 | |
| 22 | 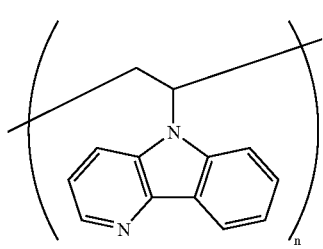 | |
| 23 | 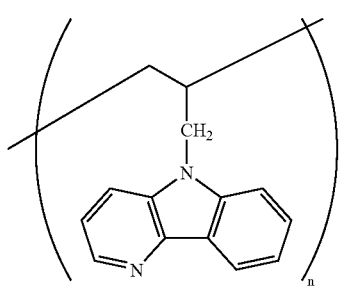 | |

-continued

| Compound | Central Moiety | A |
|---|---|---|
| 24 | | |
| 25 | | |
| 26 | | |
| 27 | | |
| 28 | | |

-continued
| Compound | Central Moiety | A |
|---|---|---|
| 29 | 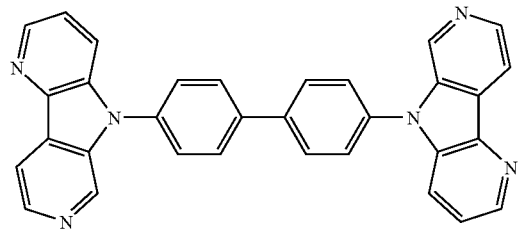 | |
| 30 | 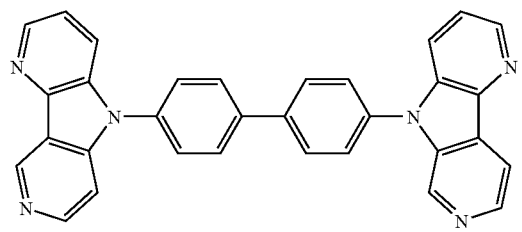 | |
| 31 | 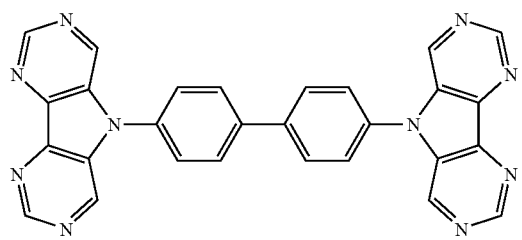 | |
| 32 | 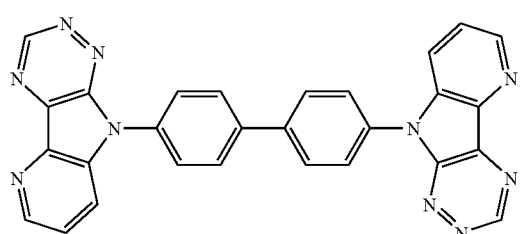 | |
| 33 | 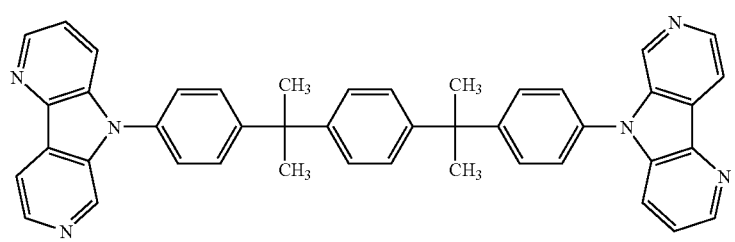 | |
| 34 | 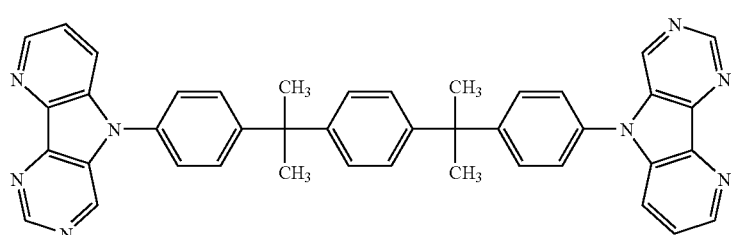 | |

-continued
| Compound | Central Moiety | A |
|---|---|---|
| 35 | 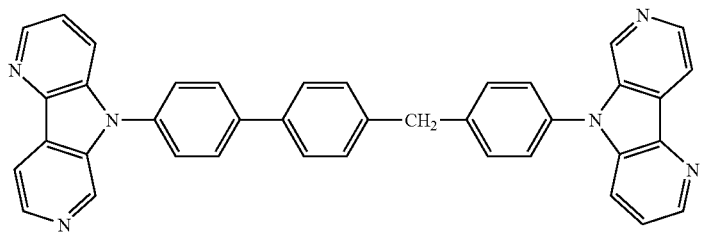 | |
| 36 | 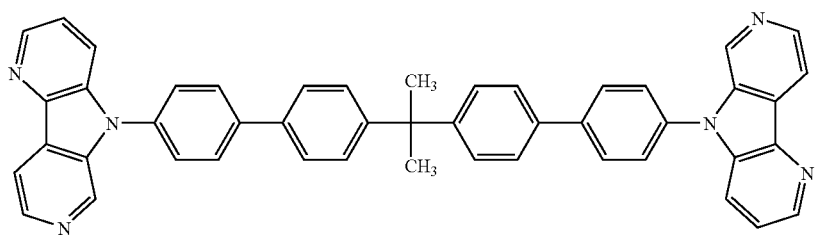 | |
| 37 | 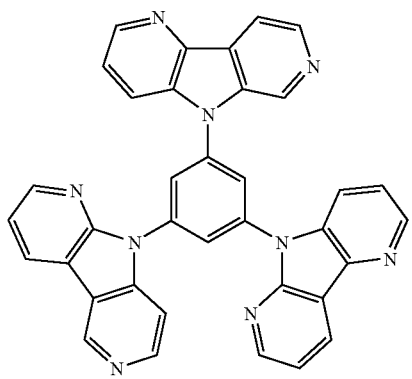 | |
| 38 | 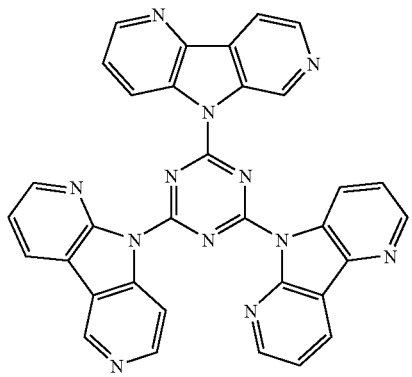 | |

| Compound | Central Moiety | A |
|---|---|---|
| 39 | | |
| 40 | | |

In the following, typical examples of preparation method of the materials for the organic EL element of the present invention will be described, however, the present invention is not limited thereto:

<<Synthesis of Compound 7>>

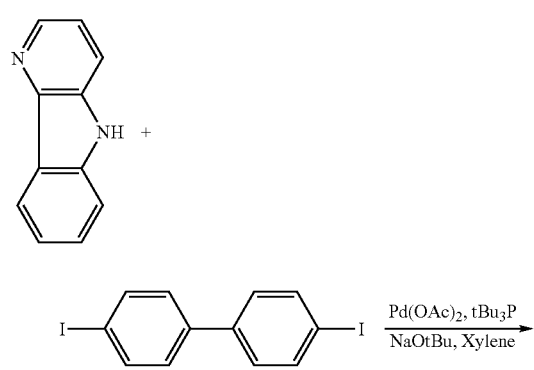

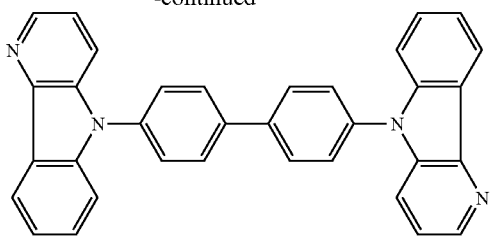

Compound 7

1.17 g of tri-tert-butylphosphine were dissolved in 10 ml of anhydrous toluene, and 50 mg of sodium borohydride was added. After the mixture was agitated for 10 minutes at ambient temperature, 5.00 g of δ-carboline, 5.87 g of 4,4-diiodobiphenyl and 3.42 g of sodium-tert-butoxide were dispersed in 50 ml of anhydrous xylene followed by stirring at reflux temperature for 10 hours under a nitrogen atmosphere. After standing the product to cool, chloroform and water were added to separate an organic layer. The organic layer was washed by water and a saturated sodium chloride solution, followed by dissolving in tetrahydrofuran. The solution was treated with activated carbon, and recrystallized to obtain 5.0 g of colorless crystals of exemplified compound 7

The structure of the exemplified compound 7 was identified with a $^1$H-NMR spectrum and a mass spectroscopy. The property and spectrum data are as follows:

MS (FAB) m/z: 487 (M$^{+1}$) $^1$H-NMR (400 MHz, CDCl$_3$): δ/ppm 7.37 (dd, J=4.7 Hz, J=8.3 Hz, 2H), 7.4-7.5 (m, 2H), 7.5-7.6 (m, 4H), 7.7-7.8 (m, 4H), 7.81 (dd, J=1.2 Hz, J=8.3 Hz, 2H), 7.9-8.0 (m, 4H), 8.48(d, J=7.8 Hz, 2H), 8.65(dd, J=1.2 Hz, J=4.6 Hz, 2H)

<<Synthesis of Exemplified Compound 18>>

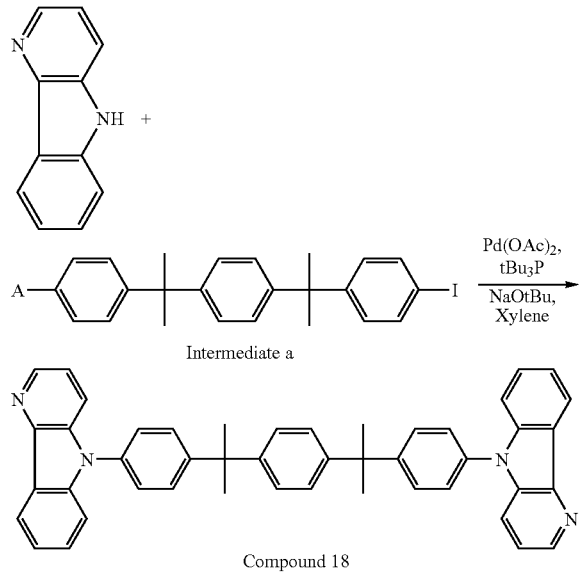

Compound 18

0.16 g of palladium acetate and 0.58 g of tri-tert-butylphosphine were dissolved in 10 ml of anhydrous toluene, and 25 mg of sodium borohydride was added. After the mixture was agitated for 10 minutes at ambient temperature, 2.00 g of δ-carboline, 3.20 g of intermediate a and 1.37 g of sodium-tert-butoxide were dispersed in 50 ml of anhydrous xylene followed by stirring at reflux temperature for 10 hours under a nitrogen atmosphere. After standing the product to cool, chloroform and water were added to separate an organic layer. The organic layer was washed by water and a saturated sodium chloride solution, and condensed under a reduced pressure. The residue was recrystallized in acetic acid, and 1.5 g of colorless crystal of the exemplified compound 18 was obtained.

The structure of the exemplified compound 144 was identified with a $^1$H-NMR spectrum and a mass spectroscopy. The spectrum data are as follows:

MS (FAB) m/z: 647 (M$^{+1}$) $^1$H-NMR (400 MHz, CDCl$_3$) δ/ppm 1.80 (S, 12H), 7.27 (S, 4H), 7.34 (dd, J=4.9 Hz, J=8.3 Hz, 2H), 7.3-7.4 (m, 2H), 7.4-7.5 (m, 12H), 7.76 (dd, J=1.3 Hz, J=8.3 Hz, 2H), 8.45 (d, J=7.8 Hz, 2H), 8.63 (dd, J=1.3 Hz, J=4.9 Hz, 2H)

In addition to the above-mentioned synthetic examples, a pyrrole derivative of the material for the organic EL element and its analog may be synthesized according to: J. Chem. Soc., Perkin Trans., 1, 1505-1510 (1999), Pol. J. Chem., 54, 1585 (1980), and Tetrahedron Lett., 41 (2000), 481-484.

Introduction of a core or a linking group, for example, an aromatic ring, a heterocyclic ring or an alkyl group into synthesized pyrrole derivative or its analog may be carried out by means of a well known method, such as Ullman coupling, a coupling which used a Pd catalyst, or Suzuki coupling.

It is necessary to have a molecular weight of not less than 450 for the material for an organic EL element of the present invention, however, the molecular weight is preferably not less than 600 and specifically preferably not less than 800, whereby the glass transition temperature and the thermal stability of the compound are increased, and a longer life of the organic EL element is obtained.

<<Determination of Molecular Weight>>

As for the determination of the molecular weight of the pyrrole derivative represented by Formula (1) of the present invention, having a molecular weight of not less than 450, the molecular weight is determined by using a commercial mass spectroscopy when the molecular weight is less than 1000. However, when the molecular weight is 1000 or more, the molecular weight of the pyrrole derivative is determined by using GPC (gel permeation chromatography) using THF (tetrahydrofuran) as a column solvent.

Specifically, 1 ml of THF is added to 1 mg of a test sample and the mixture is agitated at ambient temperature using a magnetic stirrer to sufficiently dissolve the sample. Subsequently, after processing with a membrane filter having a pore size of 0.45 to 0.50μ, the solution is poured into GPC. The condition for the GPC measurement is as follows: after stabilizing the column temperature at 40° C., THF is passed through with a flow rate of 1 ml/minute and 100 μl of sample solution of a concentration of 1 mg/ml is injected. A combination of commercial polystyrene gel columns is preferably used. Examples of the column include: a combination of SHODEX GPC KF-801, 802, 803, 804, 805, 806, and 807 produced by SHOWA DENKO K.K. and a combination of, TSKgelG 1000H, G2000H, G3000H, G4000H, G5000H, G6000H, G7000H, and TSK guard column, produced by TOSOH CORP. As a detector, a refractive index detector (IR detector) or a UV detector is preferably used. In the measurement of the molecular weight of a sample, the molecular weight distribution is determined by using a calibration curve prepared by using monodisperse standard particles of polystylene. It is preferable to use about ten polystyrene standard samples to prepare the calibration curve.

Specific measurement conditions employed in the present invention are as follows:

<<GPC Measurement Conditions>>

Model: HLC-8120 (produced by TOSOH CORP.)
Column:
TSK gel SuperH4000 (produced by TOSOH CORP.)
TSK gel SuperH3000 (produced by TOSOH CORP.)
TSK gel SuperH2000 (produced by TOSOH CORP.)
Column temperature: 40° C.
Detector: RI
Solvent: Tetrahydrofuran
Flow rate: 0.6 ml/minute
Sample concentration: 0.25%, Injection amount: 10 μl
Standard sample: The calibration curve was prepared using at least eight kinds of polyoxyethylene glycols each having different molecular weight (TOSOH CORP.; TSK STANDARD POLYETHYLENE OXIDE).
Data processor: SC-8020 (produced by TOSOH CORP.)

The material for the organic EL element of the present invention is used as a constituent of a constituting layer of the organic EL element which will be explained later. The material for the organic EL element is preferably used in a light emitting layer or in a hole blocking layer, more preferably used in a light emitting layer, and specifically preferably used as a host compound in a light emitting layer. The material for the organic EL element of the present invention or a compound of the present invention may also be used in other constituting layer of the organic EL element, if necessary, in order to control various properties of the organic EL element.

The compounds of the present invention are used as materials for the organic EL element (for example, a back light, a flat panel display, a light source of an illumination, a display device, a light source for electrophotography, a recording light source, an exposure light source, a reading light source, a sign, a signboard, an interior, an optical-transmission device). Examples of other usage include extended fields such as: materials for an organic semiconductor laser (for example, a recording light source, an exposure light source, a reading light source, an optical transmission device and a light source for electrophotography); materials for a photorecepter for electrophotography; materials for an organic TFT element (for example, an organic memory device, an organic operation device, an organic switching element); materials for an organic wavelength converter; and materials for a photoelectric conversion device (for example, a solar cell, a photosensor).

The constituting layers of the organic EL element of the present invention will be explained below in details.

Preferred examples of the constituting layers of the organic EL element of the present invention will be shown below, however, the present invention is not limited thereto.

(i): Anode/Light emitting layer/Electron transporting layer/Cathode (ii): Anode/Hole transporting layer/Light emitting layer/Electron transporting layer/Cathode (iii): Anode/Hole transporting layer/Light emitting layer/Hole blocking layer/Electron transporting layer/Cathode (iv): Anode/Hole transporting layer/Light emitting layer/Hole blocking layer/Electron transporting layer/Cathode buffering layer/Cathode (v): Anode/Anode buffering layer/Hole transporting layer/Light emitting layer/Hole blocking layer/Electron transporting layer/Cathode buffering layer/Cathode <<Anode>>

For the anode of the organic EL element, a metal, an alloy, or an electroconductive compound each having a high working function (not less than 4 eV), and mixture thereof are preferably used as the electrode material. Specific examples of such an electrode material include a metal such as Au, CuI and a transparent electroconductive material such as indium tin oxide (ITO), $SnO_2$, or ZnO. A material capable of forming an amorphous and transparent conductive layer such as IDIXO ($In_2O_3$—ZnO) may also be used. The anode may be prepared by forming a thin layer of the electrode material according to a depositing or spattering method, and by forming the layer into a desired pattern according to a photolithographic method. When required precision of the pattern is not so high (not less than 100 μm), the pattern may be formed by depositing or spattering of the electrode material through a mask having a desired form. When light is emitted through the anode, the transmittance of the anode is preferably 10% or more, and the sheet resistance of the anode is preferably not more than several hundred Ω/□. The thickness of the layer is ordinarily within the range of from 10 nm to 1 μm, and preferably from 10 to 200 nm, although it may vary due to kinds of materials used.

<<Cathode>>

On the other hand, for the cathode, a metal (also referred to as an electron injecting metal), an alloy, and an electroconductive compound each having a low working function (not more than 4 eV), and a mixture thereof are used as the electrode material. Specific examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or spattering method. The sheet resistance as the cathode is preferably not more than several hundred Ω/□, and the thickness of the layer is ordinarily from 10 nm to 1 μm, and preferably from 50 to 200 nm. It is preferable in increasing the light emission efficiency that either the anode or the cathode of the organic EL element is transparent or semi-transparent.

After a layer of the metal described above as a cathode is formed to give a thickness of from 1 to 20 nm, a layer of the transparent electroconductive material as described in the anode is formed on the resulting metal layer, whereby a transparent or semi-transparent cathode can be prepared. Employing the cathode, an element can be manufactured in which both anode and cathode are transparent.

Next, an injecting layer, a blocking layer, and an electron transporting layer used in the component layer of the organic EL element of the present invention will be explained.

<<Injecting Layer>>: Electron Injecting Layer, Hole Injecting Layer

The injecting layer is optionally provided, for example, an electron injecting layer or a hole injecting layer, and may be provided between the anode and the light emitting layer or hole transporting layer, and between the cathode and the light emitting layer or electron transporting layer as described above.

The injecting layer herein referred to is a layer provided between the electrode and an organic layer in order to reduce the driving voltage or to improve of light emission efficiency. As the buffer layer there are a hole injecting layer (an anode buffer layer) and an electron injecting layer (a cathode buffer layer), which are described in "Electrode Material" pages 123-166, Div. 2 Chapter 2 of "Organic EL element and its frontier of industrialization" (published by NTS Corporation, Nov. 30, 1998) in detail.

The anode buffer layer (hole injecting layer) is described in, for example, JP-A Nos. 9-45479, 9-260062, and 8-288069, and its examples include a phthalocyanine buffer layer represented by a copper phthalocyanine layer, an oxide buffer layer represented by a vanadium oxide layer, an amorphous carbon buffer layer, a polymer buffer layer employing and an electroconductive polymer such as polyaniline (emeraldine) and polythiophene.

The cathode buffer layer (electron injecting layer) is described in, for example, JP-A Nos. 6-325871, 9-17574, and 10-74586, in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide. The buffer layer (injecting layer) is preferably very thin and has a thickness of preferably from 0.1 to 5 µm depending on kinds of the material used.

<<Blocking Layer>>: Hole Blocking Layer, Electron Blocking Layer

The blocking layer is a layer provided if necessary in addition to the fundamental component layers as described above, and is for example a hole blocking layer as described in JP-A Nos. 11-204258, and 11-204359, and on page 237 of "Organic EL element and its frontier of industrialization" (published by NTS Corporation, Nov. 30, 1998).

The hole blocking layer is an electron transporting layer in a broad sense, and is a material having an ability of transporting electrons, however, an extremely poor ability of transporting holes, which can increase a recombination probability of electrons and holes by transporting electrons while blocking holes.

The hole blocking layer of the organic EL element of the present invention is provided adjacent to the light emitting layer. In the present invention, the hole blocking layer preferably contains the above mentioned material for the organic EL element of the present invention as a hole blocking material in the hole blocking layer, whereby an organic EL element exhibiting a higher emission efficiency is obtained, further an organic EL element exhibiting a longer life is obtained.

On the other hand, the electron blocking layer is an hole transporting layer in a broad sense, and is a material having an ability of transporting holes, however, an extremely poor ability of transporting electrons, which can increase a recombination probability of electrons and holes by transporting holes while blocking electrons.

<<Light Emitting Layer>>

The light emitting layer of the present invention is a layer where electrons and holes, injected from electrodes, an electron transporting layer or a hole transporting layer, are recombined to emit light. The portions where light emits may be in the light emitting layer or at the interface between the light emitting layer and the layer adjacent thereto.

(Host Compounds)

The light emitting layer of the present invention preferably contains a host compound and a phosphorescent compound (also referred to as a phosphorescent light emitting compound) which will be described later. In the present invention, the above described material for the organic EL element of the present invention or the compound of the present invention is preferably used as a host compound, whereby an organic EL element exhibiting higher emission efficiency is obtained. Further, other compounds besides the material for the organic EL element of the present invention or the compound of the present invention may also be used as a host compound. In the present invention, a host compound is defined as a compound of which the quantum yield of phosphorescent light emission is less than 0.01.

A plurality of known host compounds may also be used in combination. Use of a plurality of host compounds makes the control of the transfer of electrons possible, and an organic EL element exhibiting higher light emission efficiency is obtained. Also, use of a plurality of phosphorescent compounds makes it possible to mix different colors of emitted light, and an arbitrary color of emitted light is obtained. Emission of white light is possible by adjusting the types and amounts of doping of mixed phosphorescent compounds, whereby application of the organic EL element to an illuminator or a backlight is possible.

Among the known host compounds, preferable are the compounds having hole transporting ability, electron transporting ability, effect to prevent a shift of light emission to a longer wavelength side and a high Tg (a glass transition temperature).

Examples of the known host compounds include the compounds disclosed in the following documents:

JP-A No. 2001-257076, No. 2002-308855, No. 2001-313179, No. 2002-319491, No. 2001-357977, No. 2002-334786, No. 2002-8860, No. 2002-334787, No. 2002-15871, No. 2002-334788, No. 2002-43056, No. 2002-334789, No. 2002-75645, No. 2002-338579, No. 2002-105445, No. 2002-343568, No. 2002-141173, No. 2002-352957, No. 2002-203683, No. 2002-363227, No. 2002-231453, No. 2003-3165, No. 2002-234888, No. 2003-27048, No. 2002-255934, No. 2002-260861, No. 2002-280183, No. 2002-299060, No. 2002-302516, No. 2002-305083, No. 2002-305084, No. 2002-308837.

The light emitting layer may contain a host compound having a fluorescence maximum wavelength as a host compound. In this case, by a energy transfer from other host compound or a phosphorescent compound to a fluorescent compound, light emission from a host compound having a fluorescence maximum wavelength is obtained as the result of electroluminescence of an organic EL element. The host compound having a fluorescence maximum wavelength preferably has a high fluorescence quantum yield in the form of solution. Herein, the fluorescence quantum yield is preferably not less than 10%, and more preferably not less than 30%. Examples of the a host compound having a wavelength providing a fluorescence maximum wavelength include a coumarin dye, a cyanine dye, a chloconium dye, a squalenium dye, an oxobenzanthracene dye, a fluorescene dye, a rhodamine dye, a pyrylium dye, a perylene dye, a stilbene dye, and a polythiophene dye. The fluorescence quantum yield can be measured according to a method described in the fourth edition, Jikken Kagaku Koza 7, Bunko II, p. 362 (1992) published by Maruzen.

(Phosphorescent Compounds (Phosphorescent Light Emitting Compound))

A material used in the light emitting layer (hereinafter also referred to as light emitting material) preferably contains a phosphorescent compound together with the host compound described above, whereby an organic EL element exhibiting higher emission efficiency is obtained.

The phosphorescent compound in the present invention is a compound which emits light from the excited triplet, which can emit phosphorescence at room temperature (25° C.), and exhibits a phosphorescent quantum yield at 25° C. of not less than 0.01. The phosphorescent quantum yield at 25° C. is preferably not less than 0.1.

The phosphorescent quantum yield can be measured according to a method described in the fourth edition "Jikken Kagaku Koza 7", Bunko II, page 398 (1992) published by Maruzen. The phosphorescent quantum yield can be measured in a solution employing various kinds of solvents. The phosphorescent compound used in the present invention is a compound, in which the phosphorescent quantum yield measured employing any one of the solvents falls within the above-described range.

The light emission of the phosphorescent compound is divided in two types in principle, one is an energy transfer type in which recombination of a carrier occurs on the host to which the carrier is transported to excite the host, the resulting energy is transferred to the phosphorescent compound, and light is emitted from the phosphorescent compound, and the other is a carrier trap type in which recombination of a carrier occurs on the phosphorescent compound which is a carrier trap material, and light is emitted from the phosphorescent compound. However, in each type, energy level of the phosphorescent compound in excited state is lower than that of the host in excited state.

The phosphorescent compound is suitably selected from those used in the light emitting layer of an organic EL element known in the prior art.

The phosphorescent compound used in the present invention is preferably a metal complex containing a metal belonging to a groups VIII to X of the periodic table, and is more preferably an iridium compound, an osmium compound, a platinum compound (a platinum complex) or a rare earth compound, and most preferably an iridium compound.

Examples of the phosphorescent compound used in the present invention will be listed below, however, the present invention is not limited thereto. These compounds can be synthesized according to a method described in Inorg. Chem., 40, 1704-1711.

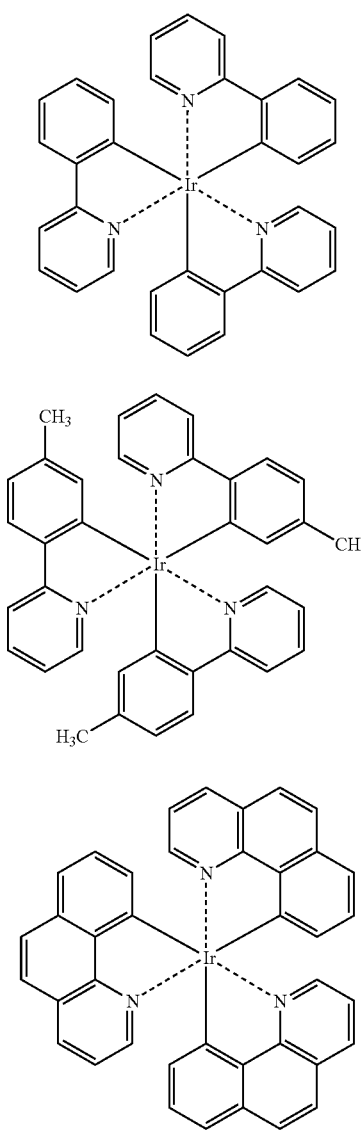

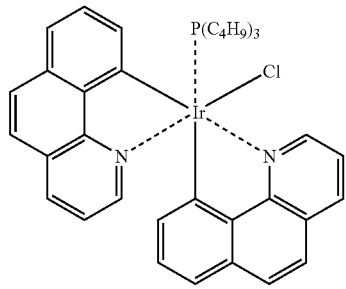

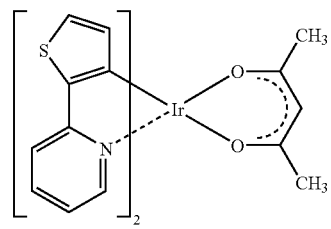

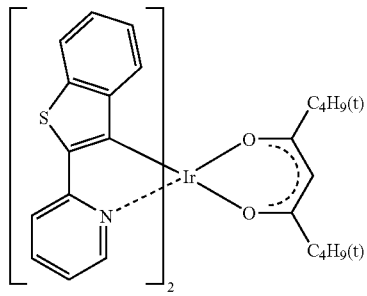

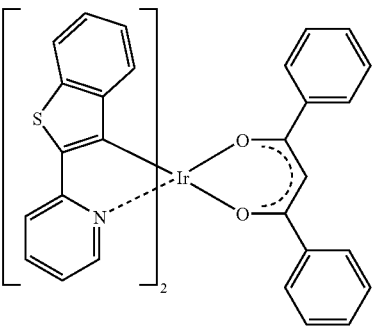

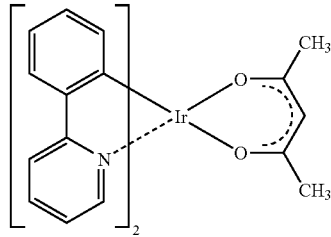

-continued
Ir-9
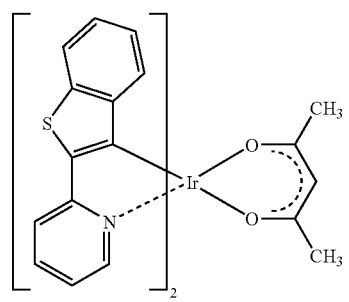
Ir-10
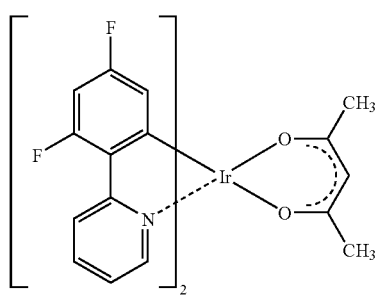
Ir-11
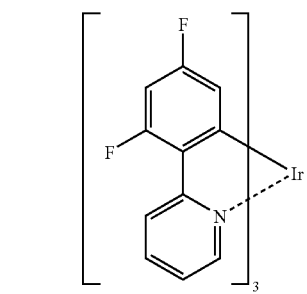
Ir-12
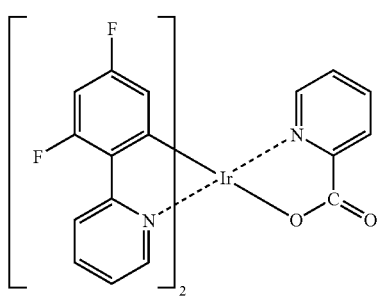
Ir-13
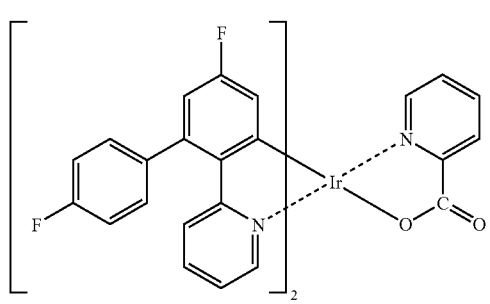
-continued
Pt-1
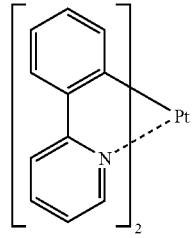
Pt-2
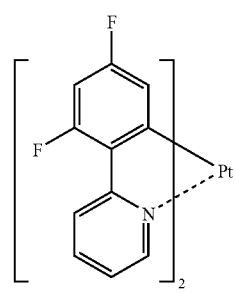
Pt-3
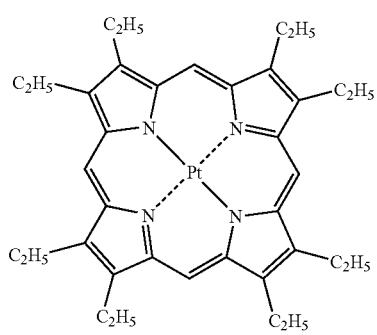
Pd-1
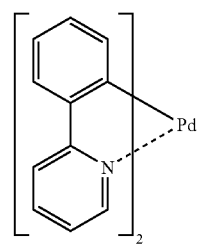
Pd-2
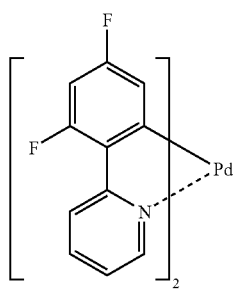

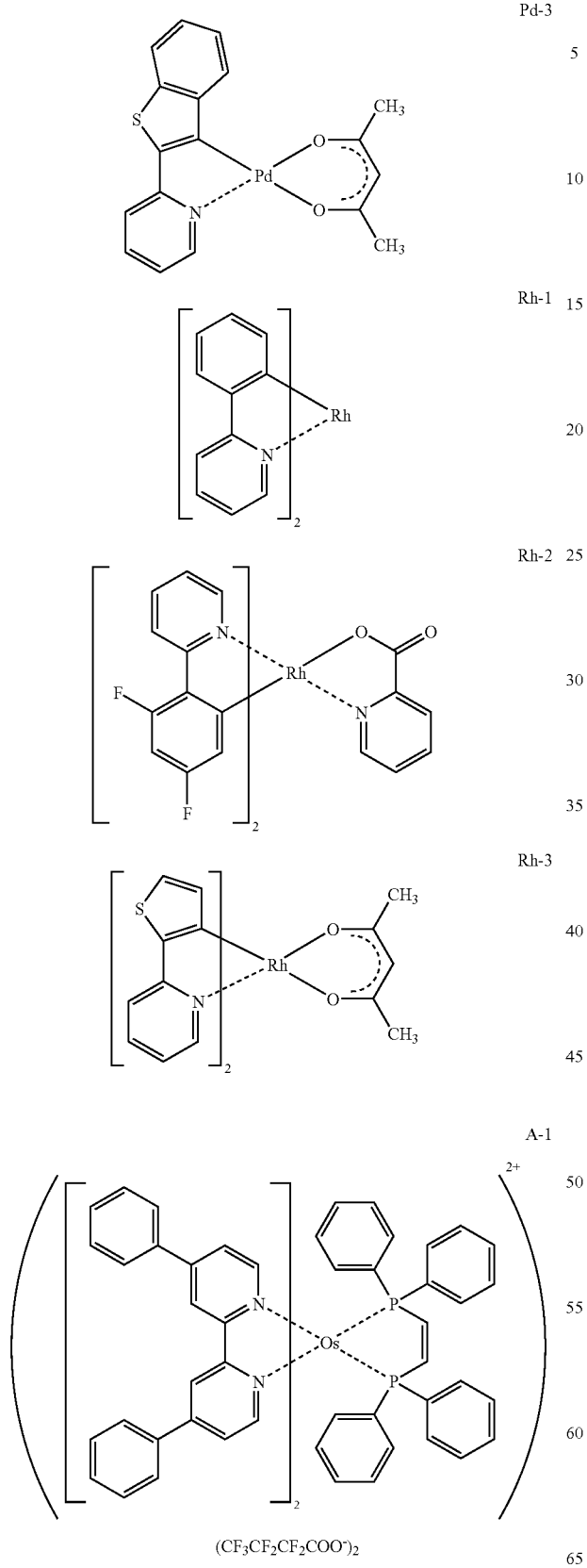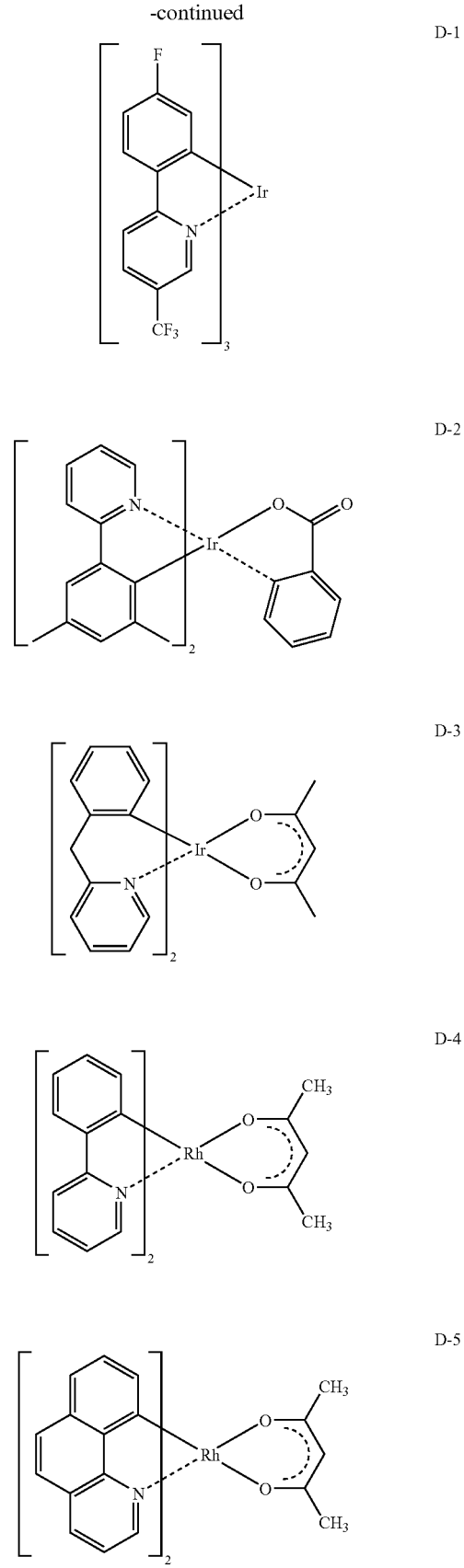

-continued

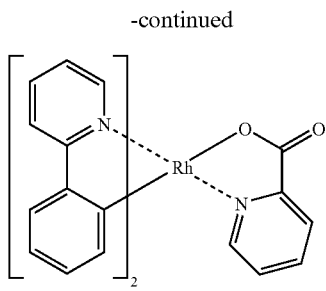

D-6

In the present invention, the wavelength of the phosphorescence maximum of the phosphorescent compound is not specifically limited. Theoretically, the phosphorescence wavelength can be varied by selecting a center metal, a ligand, or a substituent of the ligand. The phosphorescent compound preferably has a wavelength of the phosphorescence maximum in the wavelength region from 380 to 430 nm. Such an organic EL element emitting a blue or white light phosphorescence can provide higher emission efficiency.

Figure 4:
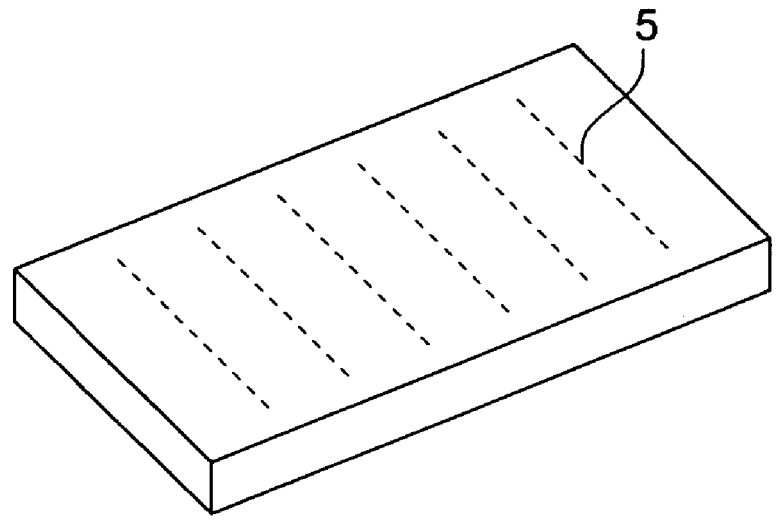
FIG. 4 is a schematic drawing of a display device employing a passive matrix method.
Figure 4:
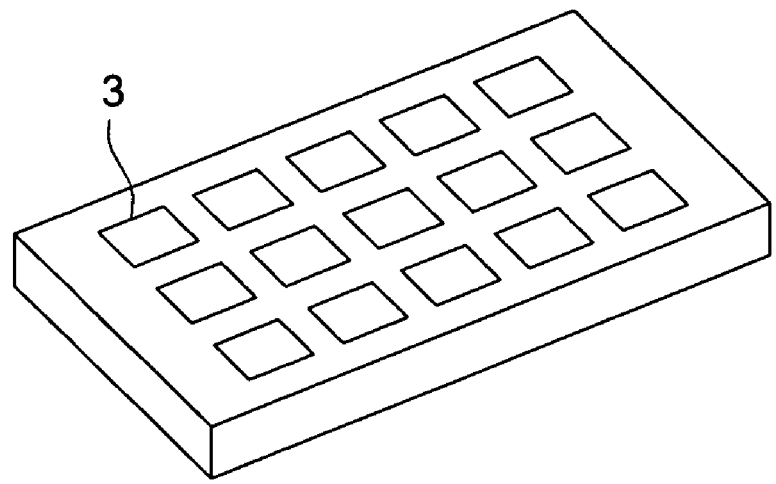
Figure 4:
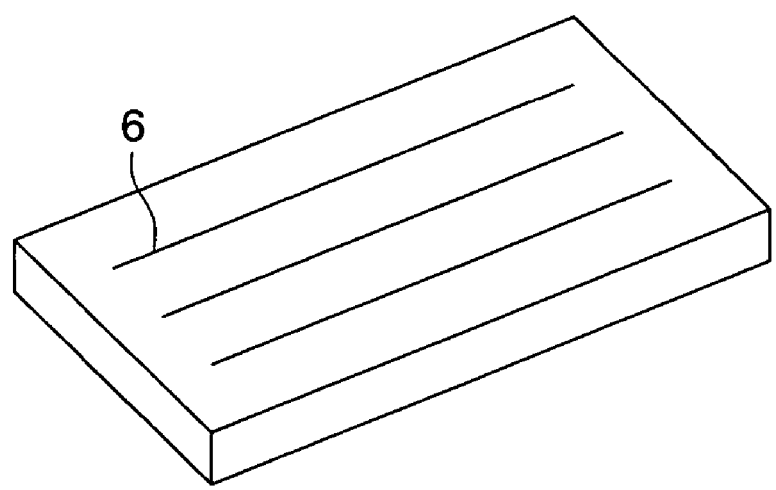

Color of light emitted from the organic EL element or the compound of the present invention is measured by a spectral light meter CS-1000, manufactured by Minolta Co., Ltd., and expressed according to CIE chromaticity diagram described in FIG. 4.16 on page 108 of "Shinpen Shikisai Kagaku Handbook" (Coloring Science Handbook, New Edition), edited by Nihon Shikisai Gakkai, published by Todai Shuppan Kai, 1985.

The light emitting layer can be formed employing the above-described compounds and a known method such as a vacuum deposition method, a spin coat method, a casting method, an LB method or an ink-jet method. The thickness of the light emitting layer is not specifically limited, however, is ordinarily from 5 nm to 5 μm, and preferably from 5 to 200 nm. The light emitting layer may be composed of a single layer comprising one or two or more of the phosphorescent compound or the host compound, or of plural layers comprising the same composition or different composition.

<<Hole Transporting Layer>>

The hole transporting layer may be either an organic substance or an inorganic substance as long as it has a hole injecting ability, a hole transporting ability or an ability to form a barrier to electrons. Examples of thereof include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, specifically a thiophene oligomer. As the hole transporting material, those described above are used, however, a porphyrin compound, an aromatic tertiary amine compound or a styrylamine compound is preferably used, and, specifically, an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl) phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N, N-diphenylaminostylbene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in JP-A No. 4-308688 such as 4,4',4''-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used. As the hole injecting material or the hole transporting material, inorganic compounds such as p-Si and p-SiC are usable.

The hole transporting layer can be formed by preparing a thin layer of the hole transporting material using a known method such as a vacuum deposition method, a spin coat method, a casting method, an ink-jet method, and an LB method. The thickness of the hole transporting layer is not specifically limited, however, is ordinarily from 5 to 5000 nm. The hole transporting layer may be composed of a single layer structure comprising one or two or more of the materials mentioned above.

<<Electron Transporting Layer>>

The electron transporting layer contains a material having an electron transporting ability, and in a broad sense an electron injecting layer or a hole blocking layer are included in an electron transporting layer. The electron transporting layer can be provided as a single layer or plural layers.

An electron transporting material (which serves also as a hole blocking material) used in a single electron transporting layer or in the electron transporting layer closest to the cathode when plural electron transporting layers are employed, may be a compound which has a function of transporting electrons injected from a cathode to a light emitting layer. The material used in the electron transporting layer can be optionally selected from known compounds used as electron transporting materials.

Examples of the material used in the electron transporting layer include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material.

A polymer in which the material mentioned above is introduced in the polymer side chain or a polymer having the material as the polymer main chain can be also used.

A metal complex of an 8-quinolynol derivative such as aluminum tris(8-quinolynol) (Alq), aluminum tris(5,7-dichloro-8-quinolynol), aluminum tris(5,7-dibromo-8-quinolynol), aluminum tris(2-methyl-8-quinolynol), aluminum tris(5-methyl-8-quinolynol), or zinc bis(8-quinolynol)

(Znq), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emitting layer may preferably be employed as the electron transporting material. An inorganic semiconductor such as n-Si and n-SiC may also be used as the electron transporting material in a similar way as in the hole transporting layer.

The electron transporting layer can be formed employing the above described electron transporting materials and a known method such as a vacuum deposition method, a spin coat method, a casting method, a printing method including an ink-jet method or an LB method. The thickness of electron transporting layer is not specifically limited, however, is ordinarily from 5 nm to 5 μm, and preferably from 5 to 200 nm. The electron transporting layer may be composed of a single layer containing one or two or more of the electron transporting material.

<<Substrate (Base Plate, Base Material, Support)>>

The organic EL element of the present invention is preferably provided on a substrate.

The substrate employed for the organic EL element of the present invention is not restricted to specific kinds of materials such as glass and plastic, as far as it is transparent. Examples of the substrate preferably used include glass, quartz and light transmissible plastic film. Specifically preferred one is a resin film capable of providing flexibility to the organic EL element.

Examples of the resin film include films of polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC), cellulose acetate propionate (CAP). The surface of the resin film may have a layer of an inorganic or organic compound or a hybrid layer of both compounds.

The external light emission efficiency of the organic electroluminescent element of the present invention is preferably not less than 1%, and more preferably not less than 5% at room temperature. Herein, external quantum yield (%) is represented by the following formula:

External quantum yield (%)=(the number of photons emitted to the exterior of the organic electroluminescent element×100)/(the number of electrons supplied to the organic electroluminescent element)

A hue improving filter such as a color filter may be used in combination or a color conversion filter which can convert emission light color from an organic EL element to multi-color employing a fluorescent compound may be used in combination. In the case where the color conversion filter is used, the λmax of the light emitted from the organic EL element is preferably not more than 480 nm.

<<Preparation of Organic EL Element>>

For one example, the preparation of the organic EL element, which has the following constitution will be described: Anode/Hole injecting layer/Hole transporting layer/Light emitting layer/Electron transporting layer/Electron injecting layer/Cathode. A thin layer of a desired material for an electrode such as a material of the anode is formed on a suitable substrate by a deposition or sputtering method to prepare the anode, so that the thickness of the layer is not more than 1 μm, and preferably within the range of from 10 to 200 nm. Then the hole injecting layer, the hole transporting layer, the light emitting layer, the electron transporting layer and the electron injecting layer, which constitute the organic EL element, are formed on the resulting anode in that order as organic compound thin layers.

As methods for formation of the thin layers, as the same as described above, there are a vacuum deposition method and a wet process (for example, a spin coating method, a casting method, an ink-jet method, and a printing method), however, a vacuum deposition method, a spin coating method, an ink-jet method and a printing method are preferably used, since a uniform layer without a pinhole can be formed. Different methods may be used for formation of different layers. When the vacuum deposition method is used for the thin layer formation method, although conditions of the vacuum deposition differs due to kinds of materials used, vacuum deposition is preferably carried out at a boat temperature of from 50° C. to 450° C., at a degree of vacuum of from $10^{-6}$ to $10^{-2}$ Pa, at a deposition speed of from 0.01 to 50 nm/second, and at a substrate temperature of from −50 to 300° C. to form a layer with a thickness of from 0.1 nm to 5 μm, preferably from 5 to 200 nm.

After these layers has been formed, a thin layer of a material for a cathode is formed thereon to prepare a cathode, employing, for example, a deposition method or sputtering method to give a thickness of not more than 1 μm, and preferably from 50 to 200 nm. Thus, a desired organic EL element is obtained. It is preferred that the layers from the hole injecting layer to the cathode are continuously formed under one time of vacuuming to obtain an organic EL element. However, on the way of the layer formation under vacuum, a different layer formation method by taking the layer out of the vacuum chamber may be inserted. When the different method is used, the process is required to be carried out under a dry inert gas atmosphere.

In the multicolor display of the present invention, the light emitting layer only is formed using a shadow mask, and the other layers, besides the light emitting layer, are formed employing a vacuum method, a casting method, a spin coat method or a printing method in which patterning employing the shadow mask is not required.

When the light emitting layer only is formed by patterning, the layer formation, although not specifically limited, is carried out preferably according to a deposition method, an ink-jet method or a printing method. When a deposition method is used as the layer formation method, patterning of the layer is preferably carried out employing a shadow mask.

Further, the organic EL element can be prepared in the reverse order, in which the cathode, the electron injecting layer, the electron transporting layer, the light emitting layer, the hole transporting layer, the hole injecting layer, and the anode are formed in that order. When a direct current voltage, a voltage of 2 to 40 V is applied to thus obtained multicolor display, setting the anode as a + polarity and the cathode as a − polarity, light emission occurs. An alternating current may also be applied to cause light emission. Arbitrary wave shape of alternating current may be used.

The display device of the present invention can be used as a display device, a display, or various light emission sources. The display device or the display, which employs three kinds of organic EL elements emitting a blue light, a red light and a green light can present a full color image.

Examples of the display device or the display include a television, a personal computer, a mobile device or an AV device, a display device for text broadcasting, and an information display used in a car. The display device may be used as specifically a display for reproducing a still image or a moving image. When the display device is used as a display for reproducing a moving image, the driving method may be either a simple matrix (passive matrix) method or an active matrix method.

Examples of an illuminator include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, however, are not limited thereto.

The organic EL element of the present invention may be an organic EL element having a resonator structure.

The organic EL element having a resonator structure is applied to a light source for a photo-memory medium, a light source for an electrophotographic copier, a light source for an optical communication instrument, or a light source for a photo-sensor, however, its application is not limited thereto. In the above application, a laser oscillation may be carried out.

<<Display Device>>

The organic EL element of the present invention can be used as a lamp such as an illuminating lamp or a light source for exposure, as a projection device for projecting an image, or as a display for directly viewing a still image or a moving image. When the element is used in a display for reproducing a moving image, the driving method may be either a simple matrix (passive matrix) method or an active matrix method. The display can present a full color image by employing two or more kinds of organic EL elements each emitting light with a different color. A monochromatic color, for example, a white color can be converted to a full color of BGR, employing a color filter. Further, employing a color conversion filter, light color emitted from the organic EL element can be converted to another color or full color, where the λmax of the light emitted from the organic EL element is preferably not more than 480 nm.

One example of the display device comprising the organic EL element of the present invention will be explained below employing Figures.

FIG. 1 is a schematic drawing of one example of a display device containing an organic EL element. FIG. 1 is a display device such as that of a cellular phone, displaying image information due to light emission from the organic EL a display section A having plural pixels and a control section B carrying out image scanning based on image information to display an image in the display section A. The control section B is electrically connected to the display section A, transmits a scanning signal and an image data signal to each of the plural pixels based on image information from the exterior, and conducts image scanning which emits light from each pixel due to the scanning signal according to the image data signal, whereby an image is displayed on the display section A.

Figure 2:
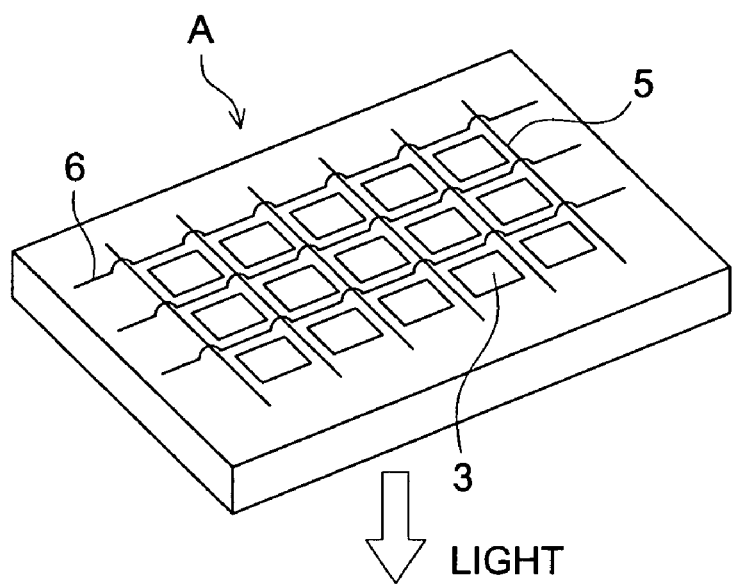
FIG. 2 is a schematic drawing of a display device section.

FIG. 2 is a schematic drawing of a display section A. The display section A contains a substrate, plural pixels 3, and a wiring section containing plural scanning lines 5 and plural data lines 6. The main members of the display section A will be explained below. In FIG. 2, light from pixels 3 is emitted in the direction of an arrow.

The plural scanning lines 5 and plural data lines 6 of the wiring section 2 each are composed of an electroconductive material, the lines 5 and the lines 6 being crossed with each other at a right angle, and connected with the pixels 3 at the crossed points (not illustrated).

The plural pixels 3, when the scanning signal is applied from the scanning lines 5, receive the data signal from the data lines 6, and emit light corresponding to the image data received. Provision of red light emitting pixels, green light emitting pixels, and blue light emitting pixels side by side on the same substrate can display a full color image.

Next, an emission process of pixels will be explained.

Figure 3:
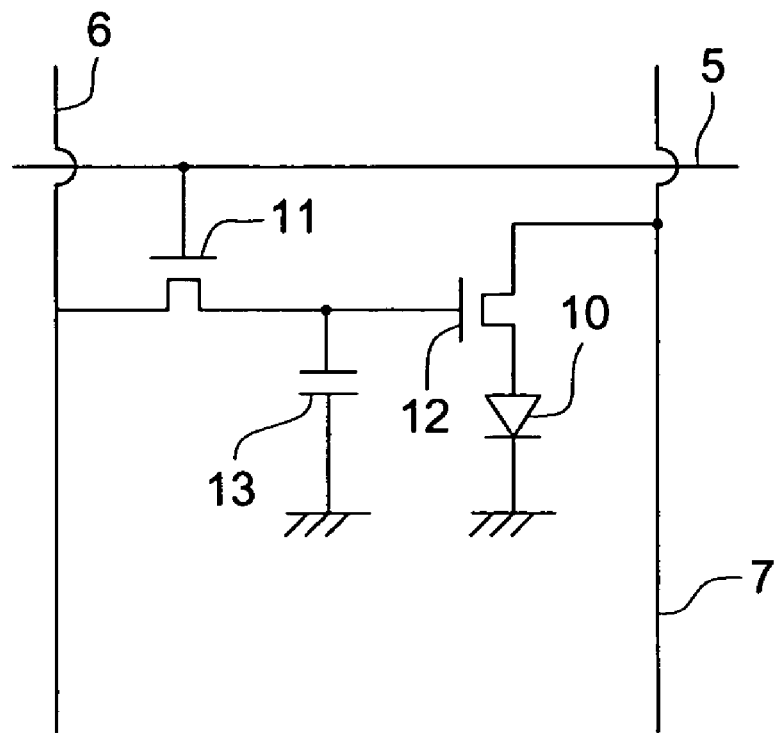
FIG. 3 is a schematic drawing of a pixel.

FIG. 3 is a schematic drawing of a pixel. The pixel contains an organic EL element 10, a switching transistor 11, a driving transistor 12, and a capacitor 13. When a pixel with a red light emitting organic EL element, a pixel with a green light emitting organic EL element, and a pixel with a blue light emitting organic EL element are provided side by side on the same substrate, a full color image can be displayed.

In FIG. 3, an image data signal is applied through the data lines 6 from the control section B to a drain of the switching transistor 11, and when a scanning signal is applied to a gate of the switching transistor 11 through the scanning lines 5 from the control section B, the switching transistor 11 is switched on, and the image signal data applied to the drain is transmitted to the capacitor 13 and the gate of the driving transistor 12.

The capacitor 13 is charged according to the electric potential of the image data signal transmitted, and the driving transistor 12 is switched on. In the driving transistor 12, the drain is connected to an electric source line 7, and the source to an organic EL element 10. Current is supplied from the electric source line 7 to the organic EL element 10 according to the electric potential of the image data signal applied to the gate.

The scanning signal is transmitted to the next scanning line 5 according to the successive scanning of the control section B, the switching transistor 11 is switched off. Even if the switching transistor 11 is switched off, the driving transistor 12 is turned on since the capacitor 13 maintains a charged potential of image data signal, and light emission from the organic EL element 10 continues until the next scanning signal is applied. When the next scanning signal is applied according to the successive scanning, the driving transistor 12 works according to an electric potential of the next image data signal synchronized with the scanning signal, and light is emitted from the organic EL element 10.

That is, light is emitted from the organic EL element 10 in each of the plural pixels 3 due to the switching transistor 11 as an active element and the driving transistor 12 each being provided in the organic EL element 10 of each of the plural pixels 3. This emission process is called an active matrix process.

Herein, light emission from the organic EL element 10 may be emission with plural gradations according to image signal data of multiple value having plural gradation potentials, or emission due to on-off according to a binary value of the image data signals.

The electric potential of the capacitor 13 may maintain till the next application of the scanning signal, or may be discharged immediately before the next scanning signal is applied.

In the present invention, light emission may be carried out employing a passive matrix method as well as the active matrix method as described above. The passive matrix method is one in which light is emitted from the organic EL element according to the data signal only when the scanning signals are scanned.

FIG. 4 is a schematic drawing of a display device employing a passive matrix method.

In FIG. 4, pixels 3 are provided between the scanning lines 5 and the data lines 6, crossing with each other. When scanning signal is applied to scanning line 5 according to successive scanning, pixel 3 connecting the scanning line 5 emits according to the image data signal. The passive matrix method has no active element in the pixel 3, which reduces manufacturing cost of a display.

The organic EL element of the present invention can be applied to an organic EL element emitting substantially white light as an illuminator. White light is obtained by mixing plural color lights, which are emitted from plural emission compounds. A combination of the plural color lights may be that of lights of three primary colors, blue, green, and red colors, each having a different emission maximum wavelength, or that of lights of complementary colors such as blue and yellow colors, or blue green and orange colors, each having a different emission maximum wavelength.

A combination of light emitting materials for obtaining plural color lights may be a combination of materials emitting plural fluorescent or phosphorescent light, or a combination of fluorescent or phosphorescent light emitting-material and colorant which emit light under excitation due to excitation light from the light emitting-materials. In the white light emitting organic EL element of the present invention, preferable is a combination of only plural light emitting dopants.

Examples of a layer construction of an organic EL element to obtain a plurality of emitting colors include: a method to mix a plurality of emitting dopants in an emitting layer; a method to provide a plurality of emitting layers each containing an emitting dopant exhibiting a different emitting wavelength from other dopant; and a method to mount minute pixels emitting lights of different wavelengths in a matrix arrangement on a substrate.

In the organic EL element emitting white light of the present invention, patterning may be carried out by using a mask, if necessary, while a layer is formed or by ink-jet printing. Patterning may be carried out only for an electrode, for an electrode and an emitting lay or for all the layers of the organic EL element.

Light emitting materials used in the light emitting layer are not specifically limited. For example, a back light used in a liquid crystal display is prepared by arbitrary selecting materials from platinum-complexes relating to the present invention or from known light emitting compounds and by using the selected materials in combination to emit white light, so that the emitted light fits the wavelength range corresponding to the CF (color filter) property.

The white light emitting organic EL element of the present invention may be suitably used for a variety of emitting light source, an illuminator for household use or in a vehicle, a kind of a lamp such as a light source for exposure, or for a display device, for example, as a back light of a liquid crystal display.

Other examples of the usage include: a backlight of a watch, an advertisement signboard, a traffic light, a light source for an optical memory medium, a light source for an electrophotographic copier, a light source for an optical communication processor, a light source for a light sensor and electric appliances for household use having a display device.

In the following, he present invention will be explained using examples, however, the present invention is not limited thereto.

EXAMPLE 1

<<Preparation of Organic EL Element Nos. 1-1 through 1-8>>

A pattern was formed on a substrate (100 mm×100 mm×1.1 mm) composed of a glass plate and a 100 nm ITO (indium tin oxide) layer (NA45 manufactured by NH Technoglass Co., Ltd.) as an anode. Then the resulting transparent substrate having the ITO transparent electrode was subjected to ultrasonic washing in isopropyl alcohol and dried by a dry nitrogen gas and subjected to UV-ozone cleaning for 5 minutes. Thus obtained transparent substrate was fixed on a substrate holder of a vacuum deposition apparatus available on the market. Further, 200 mg of α-NPD was placed in a first resistive heating molybdenum boat, 200 mg of exemplified compound 39 was put in a second resistive heating molybdenum boats 200 mg of B-Alq was placed in a third resistive heating molybdenum boat, 100 mg of Ir-1 was placed in a fourth resistive heating molybdenum boat, and 200 mg of $Alq_3$ was placed in a fifth resistive heating molybdenum boat.

The resulting boats were set in the vacuum deposition apparatus, and pressure in the vacuum tank was reduced to $4\times10^{-4}$ Pa. Then, the boat carrying α-NPD was heated by supplying an electric current to the boat, α-NPD was deposited onto the transparent substrate at a depositing rate of 0.1 nm/sec to form a first hole transporting layer. After that, the boat carrying Exemplified compound 39 and the boat carrying Ir-1 were heated by supplying an electric current to both boats, exemplified compound 39 at a depositing rate of 0.2 nm/sec and Ir-1 at a depositing rate of 0.012 nm/sec were co-deposited onto the resulting hole transporting layer to form a light emitting layer. The temperature of the substrate at the time of the deposition was room temperature. Subsequently, the boat carrying B-Alq was heated by supplying an electric current to the boat, B-Alq was deposited onto the resulting light emitting layer at a depositing rate of 0.1 nm/sec to form a hole blocking layer with a thickness of 10 nm. Further, the boat carrying $Alq_3$ was heated by supplying an electric current to the boat, $Alq_3$ was deposited onto the resulting hole blocking layer at a depositing rate of 0.1 nm/sec to form an electron transporting layer with a thickness of 40 nm. The temperature of the substrate at the time of the deposition was room temperature.

After that, a 0.5 nm thick lithium fluoride layer and a 110 nm thick aluminum layer were deposited on the resulting material to form a cathode. Thus, Organic EL Element No. 1-1 was prepared. Organic EL Element Nos. 1-2 to 1-8 were prepared in the same manner as Organic EL Element No. 1-1, except that exemplified compound 39 used as a host compound of the light emitting layer was replaced by the compounds shown below.

The structures of the compounds used above are shown below:

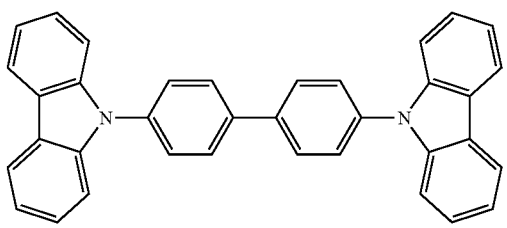

CBP

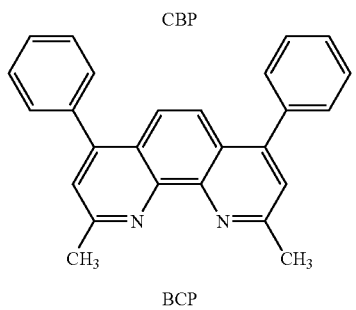

BCP

-continued

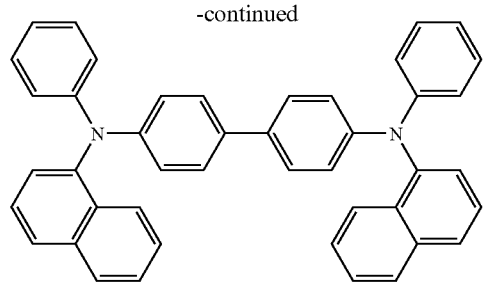

α-NPD

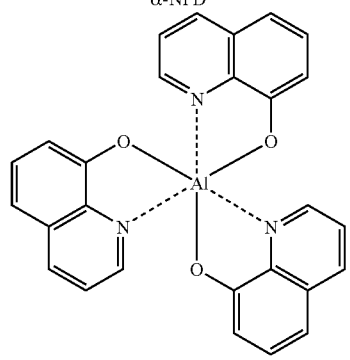

Alq₃

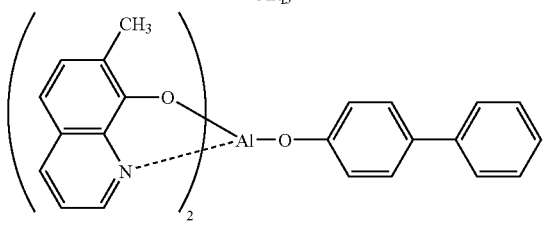

B-Alq

Comparative Compound 1

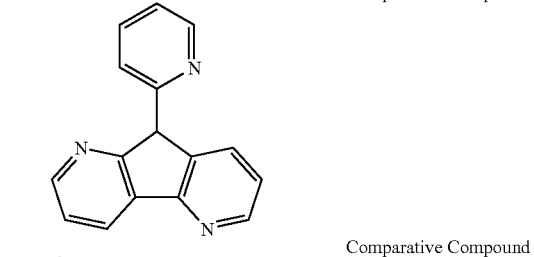

Comparative Compound 2

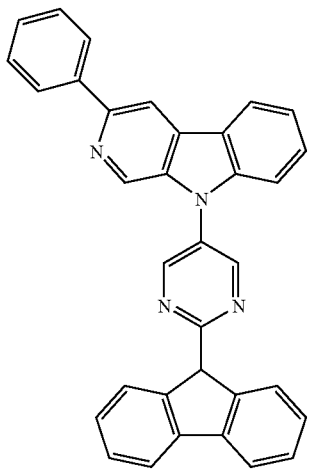

<<Evaluation of Organic EL Element Nos. 1-1 through 1-8>>

The driving lives, the luminances and the external quantum efficiencies of Organic EL Element Nos. 1-1 through 1-8 were evaluated.

<<Driving Life>>

In order to determine the driving lives of the prepared organic EL elements, each organic EL element was driven under a constant current giving a initial luminance of 1000 cd/m² at a constant temperature of 50° C. and a period in which the luminance decreased to half (500 cd/m²) of the initial value was determined to give the driving life. Driving lives of the organic EL elements were expressed by relative values when the value of driving life of a comparative sample of Organic EL Element No. 1-6 was set as 100, as shown in the following Table.

| Organic EL Element No. | Host Compound | Molecular Weight | Driving Life | Remarks |
| --- | --- | --- | --- | --- |
| 1-1 | 39 | 576.66 | 730 | Inv. |
| 1-2 | 7 | 510.66 | 685 | Inv. |
| 1-3 | 17 | 1041.27 | 725 | Inv. |
| 1-4 | 18 | 646.84 | 755 | Inv. |
| 1-5 | 9 | 571.77 | 780 | Inv. |
| 1-6 | CBP | 456.60 | 100 | Comp. |
| 1-7 | Comparative Compound 1 | 246.27 | 132 | Comp. |
| 1-8 | Comparative Compound 2 | 487.56 | 253 | Comp. |

Inv.: Present Invention,
Comp.: Comparative Sample

From the results shown in the above Table, the organic EL elements of the present invention were found to exhibit longer driving lives compared to those of the comparative samples. Also, the organic EL elements of the present invention were found to exhibit higher luminances and higher external quantum efficiencies. Herein, the luminance and the external quantum efficiency were determined by the methods described below.

<<Luminance>>

Luminance (cd/m²) was determined by using a spectral radiance meter CS-1000 produced by Konica Minolta Holdings Inc.

<<External Quantum Efficiency>>

Electric current of 2.5 mA/cm² was supplied to each sample at 23° C. in an atmosphere of a dry nitrogen gas, and the external quantum efficiency (%) of each sample was measured. The external quantum efficiency (%) was determined by using a spectral radiance meter CS-1000 produced by Konica Minolta Holdings Inc.

EXAMPLE 2

<<Preparation of Organic EL Element Nos. 2-1 through 2-8>>

A pattern was formed on a substrate (100 mm×100 mm×1.1 mm) composed of a glass plate and a 100 nm ITO (indium tin oxide) layer (NA45 manufactured by NH Technoglass Co., Ltd.) as an anode. Then the resulting transparent substrate having the ITO transparent electrode was subjected to ultrasonic washing in isopropyl alcohol and dried by a dry nitrogen gas and subjected to UV-ozone cleaning for 5 minutes. Thus obtained transparent substrate was fixed on a substrate holder of a vacuum deposition apparatus available on the market. Further, 200 mg of α-NPD was placed in a first resistive heating molybdenum boat, 200 mg of exemplified compound 13 was put in a second resistive heating molybdenum boat, 200 mg of exemplified compound 39 as a hole blocking material was placed in a third resistive heating molybdenum boat, 100 mg of Ir-1 was placed in a fourth resistive heating molybdenum boat, and 200 mg of $Alq_3$ was placed in a fifth resistive heating molybdenum boat.

The resulting boats were set in the vacuum deposition apparatus, and pressure in the vacuum tank was reduced to $4 \times 10^{-4}$ Pa. Then, the boat carrying α-NPD was heated by supplying an electric current to the boat, α-NPD was deposited onto the transparent substrate at a depositing rate of 0.1 nm/sec to form a first hole transporting layer. After that, the boat carrying Exemplified compound 13 and the boat carrying Ir-1 were heated by supplying an electric current to both boats, exemplified compound 39 at a depositing rate of 0.2 nm/sec and Ir-1 at a depositing rate of 0.012 nm/sec were co-deposited onto the resulting hole transporting layer to form a light emitting layer. The temperature of the substrate at the time of the deposition was room temperature. Subsequently, the boat carrying exemplified compound 39 was heated by supplying an electric current to the boat, exemplified compound 39 was deposited onto the resulting light emitting layer at a depositing rate of 0.1 nm/sec to form a hole blocking layer with a thickness of 10 nm. Further, the boat carrying $Alq_3$ was heated by supplying an electric current to the boat, $Alq_3$ was deposited onto the resulting hole blocking layer at a depositing rate of 0.1 nm/sec to form an electron transporting layer with a thickness of 40 nm. The temperature of the substrate at the time of the deposition was room temperature.

After that, a 0.5 nm thick lithium fluoride layer and a 110 nm thick aluminum layer were deposited on the resulting material to form a cathode. Thus, Organic EL Element No. 2-1 was prepared. Organic EL Element Nos. 2-1 to 2-8 were prepared in the same manner as Organic EL Element No. 2-1, except that exemplified compound 39 used as a hole blocking material was replaced by the compounds shown below.

<<Evaluation of Organic EL Element Nos. 2-1 Through 2-8>>

In the same manner as Example 1, the luminances, the external quantum efficiencies and the driving lives of Organic EL Element Nos. 2-1 through 2-8 were evaluated. The driving lives of the organic EL elements were expressed by relative values when the value of driving life of a comparative sample of Organic EL Element No. 2-6 was set as 100. The obtained results were shown below.

| Organic EL Element No. | Hole Blocking Material | Driving Life | Remarks |
|---|---|---|---|
| 2-1 | 39 | 420 | Inv. |
| 2-2 | 7 | 385 | Inv. |
| 2-3 | 17 | 390 | Inv. |
| 2-4 | 18 | 365 | Inv. |
| 2-5 | 9 | 440 | Inv. |
| 2-6 | B-Alq | 100 | Comp. |
| 2-7 | Comparative Compound 1 | 121 | Comp. |
| 2-8 | Comparative Compound 2 | 173 | Comp. |

Inv.: Present Invention,
Comp.: Comparative Sample

From the results shown in the above Table, Organic EL Element Nos. 2-1 through 2-5 in which pyrrole derivatives represented by Formula (1) and having molecular weights of not less than 450 were used in the hole blocking layers exhibited higher luminances and higher external quantum efficiencies as well as longer driving lives compared to those of other samples, by which the characteristics of the present invention were clearly emphasized. Also, the organic EL elements of the present invention were found to show excellent luminances and excellent external quantum efficiencies.

EXAMPLE 3

Red light emitting organic EL elements prepared in the same manner as Organic EL elements Nos. 2-1 and 2-4 in EXAMPLE 2 of the present invention, except that the phosphorescent compound was replaced by Ir-9 and a blue light emitting organic EL element prepared in the same manner as Organic EL Element No. 2-4, except that the phosphorescent compound was replaced by Ir-12 were prepared. These organic EL elements were juxtaposed on the same substrate to prepare a full color display device driven by an active matrix method, illustrated in FIG. 1. In FIG. 2, a schematic drawing of only display section A is shown. Namely, on the same substitute, a wiring section containing plural scanning lines 5 and plural data lines 6 and juxtaposed plural pixels 3 (pixels emitting red light, pixels emitting green light and pixels emitting blue light) are provided. The plural scanning lines 5 and plural data lines 6 are composed of an electroconductive material. The lines 5 and the lines 6 are crossing with each other at a right angle to form a lattice, and connected to the pixels 3 at the crossed points (details are not illustrated). The plural pixels 3 are driven by an active matrix method in which each pixel contained an organic EL element emitting a corresponding color light and active elements including a switching transistor and a driving transistor. When scanning signals are applied through the scanning lines 5, image data signals are received through data lines 6, and emission occurs according to the received image data. By juxtaposing red light emitting pixels, green light emitting pixels, and blue light emitting pixels side by side on the same substrate, display of a full color image becomes possible.

By driving the full color display device, a sharp full color moving picture with high external quantum efficiency and high durability was obtained.

Possibility for Industrial Use

The present invention provided a material for an organic electroluminescent element enabling a high emitting efficiency; and an organic electroluminescent element, an illuminator and a display device employing the material for the organic electroluminescent element. Further, the present invention provided a material for an organic electroluminescent element enabling a longer life; an organic electroluminescent element, an illuminator and a display device employing the material for the organic electroluminescent element; and new compounds preferably employed as the material for the organic EL element.

What is claimed is:

1. A pyrrole derivative for an organic electroluminescent element represented by one of Formulae (7) to (11):

Formula (7)

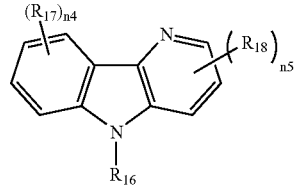

-continued

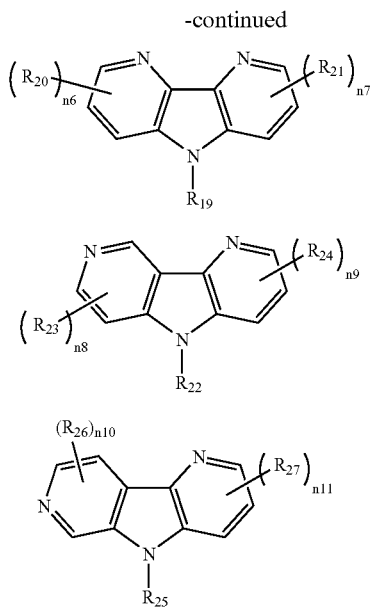

Formula (8)

Formula (9)

Formula (10)

wherein:
R$_{16}$, R$_{19}$, R$_{22}$ and R$_{25}$ each represent an alkyl group which may have a substituent, a cycloalkyl group which may have a substituent, an aryl group which may have a substituent or a heterocyclic group which may have a substituent;

R$_{17}$, R$_{18}$, R$_{20}$, R$_{21}$, R$_{23}$, R$_{24}$, R$_{26}$, and R$_{27}$ each represent a substituent;

n4 represents an integer of 0 to 4; and n5 through n11 each represent an integer of 0 to 3; and

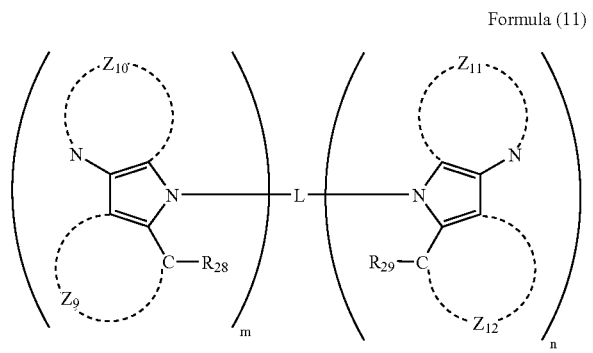

Formula (11)

wherein:
R$_{28}$, and R$_{29}$ each represent a hydrogen atom or a substituent;

Z$_9$ and Z$_{12}$ each represent a group of atoms necessary to form a 5-to 7-member fused ring;

Z$_{10}$ and Z$_{11}$ each represent a group of atoms necessary to form a nitrogen-containing 5-to 7-membered heterocycle;

L represents a linking group of divalent through tetravalent; and m and n each represent an integer of 1 or 2.

2. An organic electroluminescent element comprising a pair of electrodes having therebetween one or more constituting layers, wherein:
at least one of the constituting layers is a light emitting layer;

one of the constituting layers contains the pyrrole derivative for the organic electroluminescent element represented by the following Formula (1), and having a molecular weight of not less than 450:

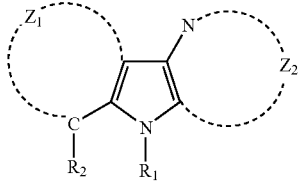

Formula (1)

wherein:
R$_1$ represents an alkyl group which may have a substituent, a cycloalkyl group which may have a substituent, an aryl group which may have a substituerit or a heterocyclic group which may have a substituent;

R$_2$ represents a hydrogen atom or a substituent;

Z$_1$ represents a group of atoms necessary to form a 5- to 7-membered fused ring combined with two carbon atoms; and Z$_2$ represents a group of atoms necessary to form a nitrogen-containing 5- to 7-mernbered heterocycle combined with a carbon atom and a nitrogen atom.

3. The organic electroluminescent element of claim 2, wherein the light emitting layer contains the pyrrole derivative for the organic electroluminescent element.

4. The organic electroluminescent element of claim 2, wherein the constituting layers contain a hole blocking layer containing the pyrrole derivative for the organic electroluminescent element.

5. The organic electroluminescent element of claim 2, wherein the organic electroluminescent element emits blue light.

6. The organic electroluminescence element of claim 2, wherein the organic electroluminescent element emits white light.

7. An illuminator comprising the organic electroluminescent element of claim 2.

8. A display device comprising the organic electroluminescent element of claim 2.

9. The organic electroluminescent element of claim 2, wherein the pyrrole derivative is represented by Formula (2)

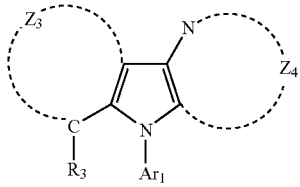

Formula (2)

wherein:
Ar$_1$ represents an aryl group which may have a subsitutent, or a heterocyclic group which may have a substituent;

R$_3$ represents a hydrogen atom or a substituent; and

Z$_3$ and Z$_4$ each represent a group of atoms necessary to form a 5- to 7-member fused ring.

10. The organic electroluminescent element of claim 2, wherein the pyrroe derivative is represented by one of Formulae (3) to (6):

Formula (3)

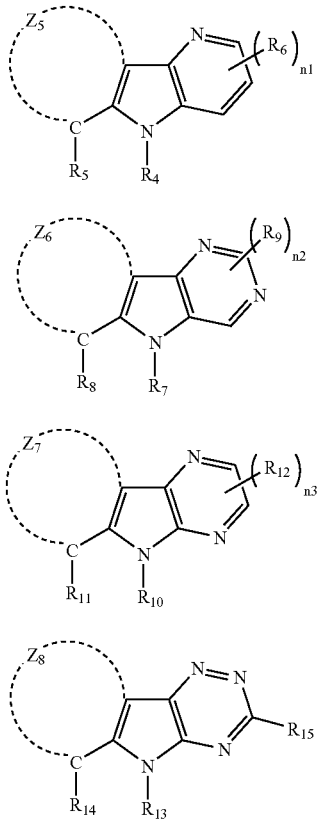

Formula (4)

Formula (5)

Formula (6)

wkherein:

$R_4$, $R_7$, $R_{10}$ and $R_{13}$ each represent an alkyl group which may have a substituent, a cycloalkyl group which may have a substituent, an aryl group which may have a substituent or a heterocyclic group which may have a substituent;

$R_5$, $R_6$, $R_8$, $R_9$, $R_{11}$, $R_{12}$, $R_{14}$, and $R_{15}$ each represent a substituent;

$Z_5$ through $Z_8$ each represent a group of atoms necessary to form a 5- to 7-membered fused ring;

n1 represents an integer of 0 to 3; and n2 and n3 each represent an integer of 0 to 2.

11. The organic electroluminescent element of claim 2, wherein the pyrrole derivative is represented by one of Formulae (7) to (10):

Formula (3)

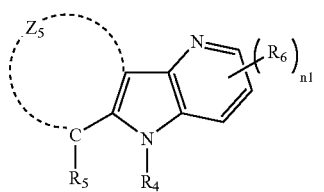

-continued

Formula (4)

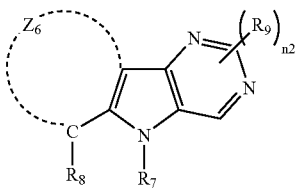

Formula (5)

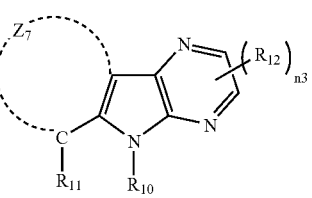

Formula (6)

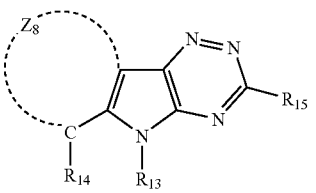

Wherein:

$R_{16}$, $R_{19}$, $R_{22}$ and $R_{25}$ each represent an alkyl group which may have a substituent, a cycloalkyl group which may have a substituent, an aryl group which may have a substituent or a heterocyclic group which may have a substituent;

$R_{17}$, $R_{18}$, $R_{20}$, $R_{21}$, $R_{23}$, $R_{24}$, $R_{26}$, and $R_{27}$, each represent a substituent;

n4 represents an integer of 0 to 4; and n5 through n11 each represent an integer of 0 to 3.

12. The organic electroluminescent element of claim 2, wherein the pyrrole derivative is represented by Formula (11)

Formula (11)

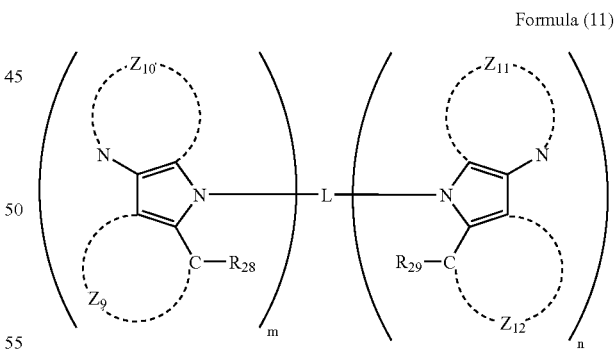

wherein:

$R_{28}$, and $R_{29}$ each represent a hydrogen atom or a substituent;

$Z_9$ and $Z_{12}$ each represent a group of atoms necessary to form a 5- to 7-membered fused ring;

$Z_{10}$ and $Z_{11}$ each represent a group of atoms necessary to form a nitrogen-containing 5- to 7-membered heterocycle;

L represents a linking group of divalent through tetravalent; and m and n each represent an integer of 1 or 2.

13. The organic electroluminescent element of claim 2 wherein a wavelength giving a fluorescence maximum of the pyrrole derivative represented by Formula (1) or Formula (2) is not more than 500 nm.

14. The organic electroluminescent element of claim 9 wherein a wavelength giving a fluorescence maximum of the pyrrole derivative represented by Formula (1) or Formula (2) is not more than 500 nm.

15. The organic electroluminescent element of claim 10 wherein a wavelength giving a fluorescence maximum of the pyrrole derivative represented by Formula (1) or Formula (2) is not more than 500 nm.

16. The organic electroluminescent element of claim 11 wherein a wavelength giving a fluorescence maximum of the pyrrole derivative represented by Formula (1) or Formula (2) is not more than 500 nm.

17. The organic electroluminescent element of claim 12 wherein a wavelength giving a fluorescence maximum of the pyrrole derivative represented by Formula (1) or Formula (2) is not more than 500 nm.

* * * * *